(12) United States Patent
Kimura et al.

(10) Patent No.: US 6,675,471 B1
(45) Date of Patent: Jan. 13, 2004

(54) METHOD OF PRODUCING HIGH-FREQUENCY MODULES

(75) Inventors: Junichi Kimura, Aichi (JP); Toshiaki Tamura, Aichi (JP); Takahiro Yajima, Gifu (JP); Kazuhiko Tsuyama, Aichi (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/545,864

(22) Filed: Apr. 7, 2000

(30) Foreign Application Priority Data

Apr. 9, 1999 (JP) .......................... 11-102258
Feb. 22, 2000 (JP) ........................ 2000-043929

(51) Int. Cl.⁷ .............................. H05K 3/10; H05K 3/02
(52) U.S. Cl. ........................ 29/846; 29/412; 29/426.5; 29/847; 29/884; 29/885; 72/379.2; 174/52.2; 174/52.4; 174/261; 174/262; 361/736; 361/744; 361/772; 361/773; 361/790
(58) Field of Search ................... 29/412, 413, 414, 29/415, 417, 846, 847, 426.5, 884, 885, 611–613; 26/525.14; 72/379.2; 174/52.2, 52.4, 261, 262; 361/736, 744, 772, 773, 790

(56) References Cited

U.S. PATENT DOCUMENTS

| | | | | |
|---|---|---|---|---|
| 3,964,087 A | * | 6/1976 | Mallon | 338/306 |
| 5,191,708 A | * | 3/1993 | Kasukabe et al. | 29/846 |
| 5,211,047 A | * | 5/1993 | Kaneyuki | 72/313 |
| 5,266,739 A | * | 11/1993 | Yamauchi | 174/52.2 |
| 5,356,838 A | * | 10/1994 | Kim | 437/226 |
| 5,455,384 A | * | 10/1995 | Ichihara | 174/52.2 |
| 5,600,101 A | * | 2/1997 | Sakai | 174/261 |
| 5,614,443 A | * | 3/1997 | Nakashima et al. | 156/253 |
| 5,635,669 A | * | 6/1997 | Kubota et al. | 174/52.1 |
| 5,832,600 A | * | 11/1998 | Hashimoto | 29/841 |
| 5,847,930 A | * | 12/1998 | Kazle | 361/736 |
| 5,898,344 A | * | 4/1999 | Hayashi | 331/67 |
| 6,073,340 A | * | 6/2000 | Shirai et al. | 29/611 |
| 6,151,771 A | * | 11/2000 | Tzeng et al. | 29/610.1 |
| 6,176,762 B1 | * | 1/2001 | Shimizu et al. | 451/28 |
| 6,262,388 B1 | * | 7/2001 | Canella et al. | 219/121.68 |

FOREIGN PATENT DOCUMENTS

| | | | | | |
|---|---|---|---|---|---|
| JP | 58070412 A | * | 4/1983 | | G11B/5/10 |
| JP | 03147502 A | * | 6/1991 | | G11B/5/11 |

* cited by examiner

*Primary Examiner*—Peter Vo
*Assistant Examiner*—Paul Kim
(74) *Attorney, Agent, or Firm*—Wenderoth, Lind & Ponack, L.L.P.

(57) ABSTRACT

A method of producing high-frequency modules at a higher efficiency is provided comprising: an electronic components mounting step 62 of fabricating on a master substrate 21 rows of sub substrates 22, each the sub substrate 22 having an identical pattern of circuit developed thereon, and mounting electronic components on the sub substrate 22; a step 64 of, after the step 62, providing slits for electrically isolating signal terminals formed integrally; a laser trimming step 66 of, after the step 64, engaging pins 39 of an inspection tooling in direct contact with the signal terminals to conduct an inspection; and a separating step 72 of, after the step 66, separating the sub substrates 22 from the master substrate 21. Accordingly, the productivity for the high-frequency modules will be improved.

37 Claims, 19 Drawing Sheets

METHOD OF PRODUCING HIGH-FREQUENCY MODULES

BACKGROUND OF THE INVENTION

The present invention relates to a method of producing high-frequency modules for use in, for example, portable telephones. Conventional voltage-controlled oscillators (referred to as VCOs, an example of high-frequency modules) are manufactured by a method comprising a first step of mounting electronic components onto a group of sub substrates 2 configured in a uniform pattern and joined to each other on a master substrate 1 as shown in FIG. 17, a second step of separating the sub substrates 2 on the main substrate 1 from each other as shown in FIG. 18 as following the first step, a third step of examining each of the separated sub substrates 2 for its correct function via connection with a power supply and trimming with a laser beam using the inductance of a resonant circuit fabricated in the pattern to determine the frequency as following the second step, a fourth step of covering the sub substrate 2 with a shielding case 3 as shown in FIG. 19 as following the third step, and a fifth step of carrying out a final inspection as following the fourth step.

FIG. 20 is an enlarged view of a primary part of the master substrate 1 showing rows of the sub substrates 2 of a rectangular shape joined to each other on the master substrate 1, both ends of the rows of the sub substrates 2 being linked to connector regions 4 at both edges of the master substrate 1. Signal terminals 5, 6, 7, and 8 are provided on both side edges 10 of each the sub substrates 2. Grounding terminals 9 are provided on the side edges 10 while grounding terminals 11 are provided on both longitudinal end edges 12 of the sub substrate 2. The signal terminal 5 may be connected to a first circuit 13 in the pattern which is then connected by a second circuit 14 to the signal terminal 6 at the other side. The signal terminal 7 may be connected by a third circuit 15 to the signal terminal 8 at the other side. Dummy regions 16 are provided as will be punched off by a punch for defining the side edges 10 of the sub substrate 2. The longitudinal end edges 12 are grooved in V shape for ease of separating the sub substrates 2 from each other.

SUMMARY OF THE INVENTION

Such a conventional method, as described above, of fabricating high-frequency modules, namely VCOs, has a drawback in that the sub substrates 2 are separated from the master substrate 1 at the second step and then aligned again for the frequency adjustment at the third step, hence lowering the efficiency of the production process. The present invention has been developed for eliminating the foregoing drawback and its object is to provide a method of producing high-frequency modules at a higher rate of the production efficiency.

For achievement of the object of the present invention, the method of producing high-frequency modules comprises: a first step of fabricating, on a master substrate, a plurality of sub substrates linked to connector regions at both ends of the master substrate, each the sub substrates formed of substantially a rectangular shape and having an identical pattern of circuit developed thereon, providing, on both side edges of the sub substrate, a set of signal terminals connected to a first circuit so that the signal terminals at each side edge are formed integral with other signal terminals provided on the corresponding side edge of the neighbor sub substrate and connected to a second circuit, and mounting electronic components on the sub substrate; a second step of, after the first step, electrically isolating the signal terminals at each side edge of the sub substrates from the other signal terminals at the corresponding side edge of the neighbor sub substrate while the connector regions of the master substrate remain linked to the sub substrates; a third step of, after the second step, conducting a first inspection with pins of an inspection tooling engaged in direct contact with the signal terminals of the sub substrates; and a fourth step of, after the third step, separating the sub substrates from the master substrate by cutting along the longitudinal end edges of each the sub substrates. Accordingly, the productivity for the high-frequency modules will be improved.

As a first feature of the present invention, a method of producing high-frequency models comprises: a first step of fabricating, on a master substrate, a plurality of sub substrates linked to connector regions at both ends of the master substrate, each the sub substrates formed of substantially a rectangular shape and having an identical pattern of circuit developed thereon, providing, on both side edges of the sub substrate, a set of signal terminals connected to a first circuit so that the signal terminals at each side edge are formed integral with other signal terminals provided on the corresponding side edge of the neighbor sub substrate and connected to a second circuit, and mounting electronic components on the sub substrate; a second step of, after the first step, electrically isolating the signal terminals at each side edge of the sub substrates from the other signal terminals at the corresponding side edge of the neighbor sub substrate while the connector regions of the master substrate remain linked to the sub substrates; a third step of, after the second step, conducting a first inspection with pins of an inspection tooling engaged in direct contact with the signal terminals of the sub substrates; and a fourth step of, after the third step, separating the sub substrates from the master substrate by cutting along the longitudinal end edges of each the sub substrates. As the second step is provided for electrically isolating the signal terminals on the side edges of any two adjacent sub substrates from each other, the method can be carried out up to the third step for the inspection using the form of a worksheet. Since the sub substrates are separated from each other after the third step, the productivity will significantly be increased without conducting such a troublesome step as in a conventional method of separating sub substrates and then aligning them again for the inspection.

Also, because the separation of the sub substrates is performed directly at the signal terminals on their side edges, such dummy portions to be punched out as in a conventional method can be eliminated and the loss of substrate materials can be minimized hence contributing to the lower cost of the production.

As a second feature of the present invention, the method of producing high-frequency modules according to the first feature is modified in that the electrically isolating the signal terminals at the second step is implemented by providing slits. This permits any two adjacent signal terminals to be electrically isolated from each other at higher certainty. Also, the electrical isolation is physically implemented thus eliminating such a troublesome process as a cutting of the side edges of the sub substrates by means of the fingers of a worker.

As a third feature of the present invention, the method of producing high-frequency modules according to the first feature is modified in that the electrical isolation of the signal terminals at the second step is implemented by providing grooves. The grooves permit the sub substrates to be isolated from each other only electrically but not physically, whereby the sub substrates, when urged by the pins at the third step, can hardly be deflected by the urging force hence ensuring the reliability of the first inspection of the third step.

As a fourth feature of the present invention, the method of producing high-frequency modules according to the first feature is modified in that, when the pins are moving to engage in direct contact at the third step, their grounding pines are allowed to touch at the earliest and when disengaging, to depart at the latest. This sequence of energization can ensure the inspection at a higher electrical stability.

As a fifth feature of the present invention, the method of producing high-frequency modules according to the first feature is modified in that the first inspection is to inspect a group of the sub substrates at once. This can improve the efficiency of the inspection.

As a sixth feature of the present invention, the method of producing high-frequency modules according to the first feature is modified in that the fourth step is followed by a fifth step of conducting a second inspection and then a sixth step of mounting the finished high-frequency modules on a tape. As the sub substrates have been separated from each other, they are finally subjected to the second inspection. The resultant high-frequency modules can thus be uniform in the performance. Also, the high-frequency modules are mounted on a tape and can thus be fed into a surface-mounting apparatus at a higher speed. The modules on the tape can easily be stored.

As a seventh feature of the present invention, another method of producing high-frequency modules comprises: a first step of fabricating, on a master substrate, a plurality of sub substrates linked to connector regions at both ends of the master substrate, each the sub substrates formed of substantially a rectangular shape and having an identical pattern of circuit developed thereon, providing on both side edges of the sub substrate, a set of signal terminals connected to a first circuit so that the signal terminals at each side edge are formed integral with other signal terminals provided on the corresponding side edge of the neighbor sub substrate and connected to a second circuit, and electrically isolating any two adjacent sub substrates from each other at their longitudinal end edges; a second step of, after the first step, mounting electronic components on each the sub substrates; a third step of, after the second step, electrically isolating the signal terminals at each side edge of the sub substrates from the other signal terminals at the corresponding side edge of the neighbor sub substrate while the connector regions of the master substrate remain linked to the sub substrates; a fourth step of, after the third step, conducting an inspection with pins of an inspection tooling engaged in direct contact with the signal terminals of the sub substrates; and a fifth step of, after the fourth step, separating the sub substrates from the master substrate by cutting along the longitudinal end edges of each the sub substrates.

While the sub substrates are electrically isolated from each other at the longitudinal end edges at the first step, they are electrically isolated at the side edges at the third step. The method can thus be proceeded up to the final fourth step using the form of a worksheet. As the sub substrates are physically separated from each other after the fourth step, such a troublesome step as in a conventional method of separating sub substrates and aligning them again for the test will be eliminated. As the sub substrates are carried in the form of a worksheet up to the final electrical inspection, the productivity will significantly be increased as compared with any conventional method.

Also, because the electrical separation of the sub substrate from each other is conducted directly at the signal terminals provided on their side edges, such dummy portions to be punched out as in a conventional method can be eliminated and the loss of substrate materials can be minimized hence contributing to the lower cost of the production.

As an eighth feature of the present invention, the method of producing high-frequency modules according to the seventh feature is modified in that the electrical isolation of the signal terminals at the third step is implemented by providing slits. This permits any two adjacent signal terminals to be electrically isolated from each other at higher certainty. Also, the electrical isolation is physically implemented thus eliminating such a troublesome process as of cutting the side edges of the sub substrates by means of the fingers of a worker.

As a ninth feature of the present invention, the method of producing high-frequency modules according to the seventh feature is modified in that the electrical isolation of the signal terminals at the third step is implemented by providing grooves. The grooves permit the sub substrates to be isolated from each other only electrically but not physically, whereby the sub substrates, when urged by the pins at the fourth step, can hardly be deflected by the urging force hence ensuring the reliability of the inspection of the fourth step.

As a tenth feature of the present invention, the method of producing high-frequency modules according to the seventh feature is modified in that when the pins are moving to engage in direct contact at the fourth step, their grounding pins are allowed to touch at the earliest and when disengaging, to depart at the latest. This sequence of energization can ensure the inspection at a higher electrical stability.

As an eleventh feature of the present invention, the method of producing high-frequency modules according to the seventh feature is modified in that the inspection at the fourth step is to inspect a group of the sub substrates at once. This can improve the efficiency of the inspection.

As a twelfth feature of the present invention, the method of producing high-frequency modules according to the eleventh feature is modified in that the inspection at the fourth step is conducted by pressing the pins against substantially identical locations on the signal terminals of each the sub substrate and feeding the signal terminals with an electric signal. This allows the sub substrates to be inspected under uniform conditions.

As a thirteenth feature of the present invention, the method of producing high-frequency modules according to the eighth feature is modified in that the third step of electrically isolating the signal terminals at each side edge of the sub substrates from the other signal terminals at the corresponding side edge of the neighbor sub substrate while the connector regions of the master substrate remain linked to the sub substrates is followed by a step of covering the sub substrate with a shielding case. Since the sub substrate is covered with the shielding case, it can be handled with much ease. Also, the sub substrate can hardly be affected by external noises and do not emit any noise to the outside.

As a fourteenth feature of the present invention, the method of producing high-frequency modules according to the thirteenth feature is modified in that the cutting edges of the sub substrate are created by cutting along the slits so as to extend more outwardly than the shielding case. Since the cutting edges of the sub substrate extends more outwardly than the shielding case, any scratching damage to the shielding case caused by a cutting blade for separating the sub substrates from the master substrate can be avoided successfully. Also, in case that an external stress is exerted, it will hardly be transmitted directly to the soldered portion of the shielding case hence creating no cracking.

As a fifteenth feature of the present invention, the method of producing high-frequency modules according to the thirteenth feature is modified in that the cutting edges of the sub substrate are created by cutting along the slits so as to be substantially flush with the sides of the shielding case. As the cutting edges of the sub substrate do not extend outwardly of the side edges, the resultant high-frequency modules can be reduced in the overall size. Also, the loss of sub substrate materials will be minimized.

As a sixteenth feature of the present invention, the method of producing high-frequency modules according to the fifteenth feature is modified in that the sides of the shielding case are more roughed on their surface than the top. As the top side is roughed, the overall surface area of the shielding case can be increased thus improving the radiation of heat. Also, as its roughed surface increases the force of friction, the high-frequency module can be captured and picked up with much ease.

As a seventeenth feature of the present invention, the method of producing high-frequency modules according to the sixteenth feature is modified in that the sub substrates are separated from each other with the use of a rotary blade which is also adapted for roughing the sides of the shielding case. This eliminates an extra step for preparing the roughed surface, hence improving the productivity.

As an eighteenth feature of the present invention, the method of producing high-frequency modules according to the thirteenth feature is modified in that the shielding case is fabricated by punching a sheet of material with dies, bending the sheet in the direction of punching to form bends, and soldering the distal ends of the bends or legs to the grounding terminals provided on the side edges of the sub substrate. The punching forms such burrs on the shielding case as creating a clearance between the shielding case and the grounding terminals. The clearance is thus filled thoroughly with solder due to the effect of capillary action, whereby the resistance to conductivity will be minimized and the bonding strength will be increased. Also, the burrs are formed inwardly of the side edges of the sub substrate, hence minimizing the distance between any two adjacent sub substrates and decreasing the loss of sub substrate materials.

As a nineteenth feature of the present invention, the method of producing high-frequency modules according to the thirteenth feature is modified in that the shielding case is marked down on its top side using a laser beam. The laser beam can apply markings in a smaller area. In addition, the markings applied by the laser beam can highly be resistant to the rubbing of a finger.

As a twentieth feature of the present invention, the method of producing high-frequency modules according to the seventh feature is modified in that the fifth step of separating the sub substrates from the master substrate is followed by a sixth step of mounting the finished high-frequency modules on a tape. The high-frequency modules, when having been separated, are saved on a tape and can thus be loaded to a surface-mounting apparatus at a higher speed. Moreover, the tape can easily be stored.

As a twenty first feature of the present invention, a further method of producing high-frequency modules comprises: a first step of fabricating, on a master substrate, a plurality of sub substrates linked to connector regions at both ends of the master substrate, each the sub substrates formed of substantially a rectangular shape and having an identical pattern of circuit developed thereon, and mounting electronic components on each of the sub substrates; a second step of, after the first step, covering the sub substrate with a shielding case; a third step of, after the second step, separating the sub substrates from the master substrate by cutting along the side edges of the sub substrates. The sub substrates are covered with their respective shielding cases while they are in the worksheet form, which is much easier than a process in a conventional method, hence improving the productivity. Also, since the substrates are covered with the shielding cases, the modules can be handled with much ease. Furthermore, the module will hardly be affected by external noises and do not emit any noise to the outside.

As a twenty second feature of the present invention, the method of producing high-frequency modules according to the twenty first feature is modified in that the cutting edges of the sub substrate are created by cutting along the side edges so as to extend more outwardly than the shielding case. Since the cutting edges of the sub substrate extends more outwardly than the shielding case, any scratching damage to the shielding case caused by a cutting blade for separating the sub substrates from the master substrate can be avoided successfully. Also, in case that an external stress is exerted, it will hardly be transmitted directly to the soldered portion of the shielding case hence creating no cracking.

As a twenty third feature of the present invention, the method of producing high-frequency modules according to the twenty first feature is modified in that the cutting edges of the sub substrate are created by cutting along the slits so as to be substantially flush with the sides of the shielding case. As the cutting edges of the sub substrate do not extend outwardly of the side edges, the resultant high-frequency modules can be reduced in the overall size. Also, the loss of sub substrate materials will be minimized.

As a twenty fourth feature of the present invention, the method of producing high-frequency modules according to the twenty third feature is modified in that the sides of the shielding case are more roughed on their surface than the top. As the top side is roughed, the overall surface area of the shielding case can be increased thus improving the radiation of heat. Also, as its roughed surface increases the force of friction, the high-frequency module can be captured and picked up with much ease.

As a twenty fifth feature of the present invention, the method of producing high-frequency modules according to the twenty fourth feature is modified in that the sub substrates are separated from each other with the use of a rotary blade which is also adapted for roughing the sides of the shielding case. This eliminates an extra step for preparing the roughed surface, hence improving the productivity.

As a twenty sixth feature of the present invention, the method of producing high-frequency modules according to the twenty first feature is modified in that a step of engaging pins of an inspection tooling in direct contact with signal terminals of the sub substrate to conduct an inspection is provided between the second step and the third step. The sub substrates can be processed up to the final electrical inspection while they are in the worksheet form, as compared with such a troublesome step of separating sub substrates and then aligning them again for the inspection, hence improving the productivity.

As a twenty seventh feature of the present invention, the method of producing high-frequency modules according to the twenty first feature is modified in that the shielding case is fabricated by punching a sheet of material with dies, bending the sheet in the direction of punching to form bends, and soldering the distal ends of the bends or legs to the grounding terminals provided on the side edges of the sub substrate. The punching forms such burrs on the shielding case as creating a clearance between the shielding case and the grounding terminals. The clearance is thus filled thoroughly with solder due to the effect of capillary action, whereby the resistance to conductivity will be minimized and the bonding strength will be increased. Also, the burrs are formed inwardly of the side edges of the sub substrate, hence minimizing the distance between any two adjacent sub substrates and decreasing the loss of sub substrate materials.

DESCRIPTION OF THE PREFERRED EMBODIMENTS

Preferred embodiments of the present invention will be described referring to the accompanying drawings.

(Embodiment 1)

Figure 2:
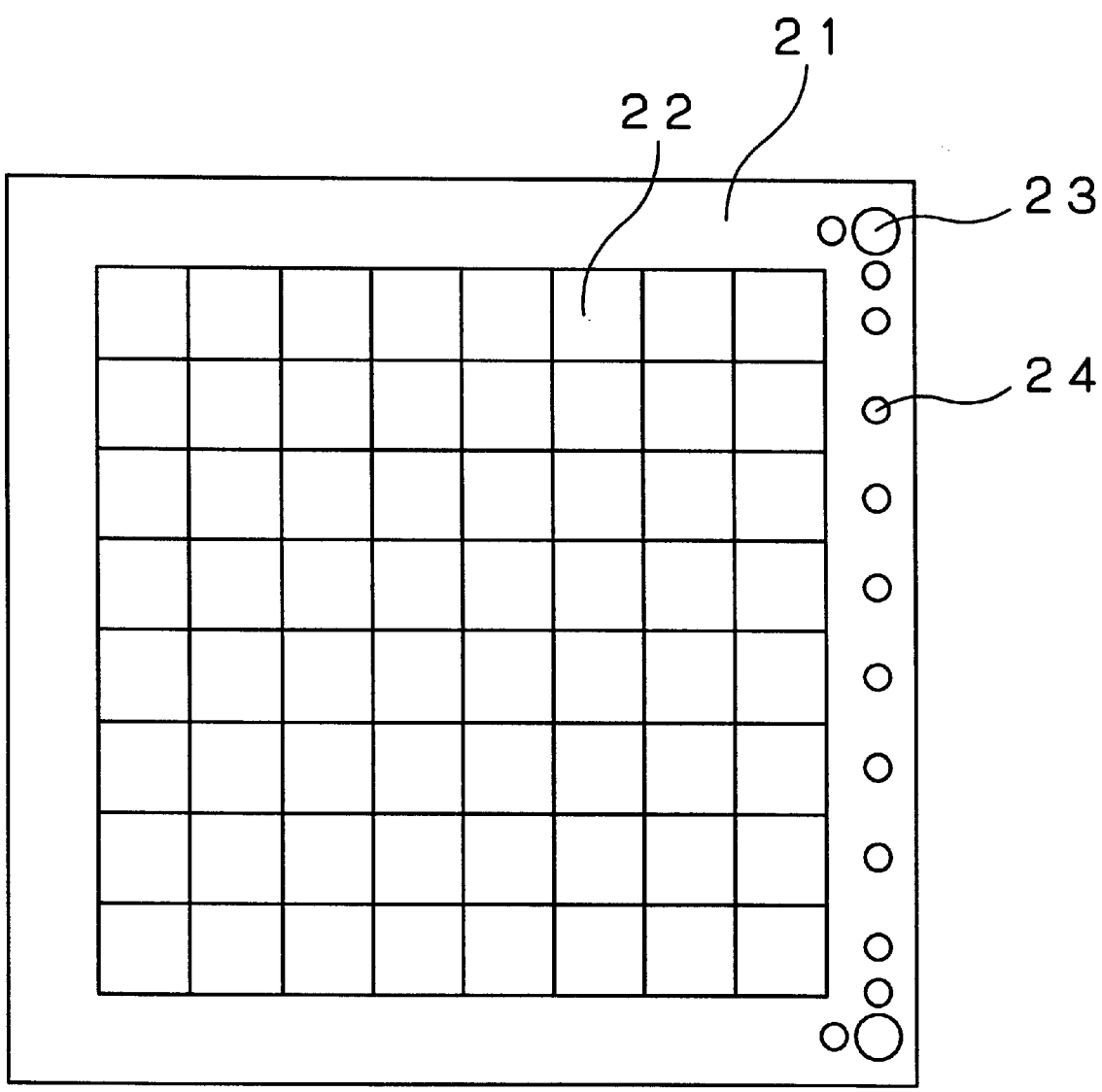
FIG. 2 is a plan view of a master substrate on which the high-frequency modules are fabricated according to Embodiment 1 of the present invention.

Embodiment 1 of the present invention is now explained of producing high-frequency modules in the form of VCOs. FIG. 2 is a plan view of a master substrate 21 which has a four-layer construction. The master substrate 21 is shaped to an overall configuration of 91 mm×94 mm incorpating 168 sub substrates 22 of 6.5 mm×5.3 mm in size joined to each other. The sub substrate 22 has a uniform pattern of wiring interconnecting electronic components thereon. The master substrate 21 has positioning holes 23 provided therein and markings 24 applied thereon for identifying the position thereof to permit the mounting of the electronic components.

Figure 3:
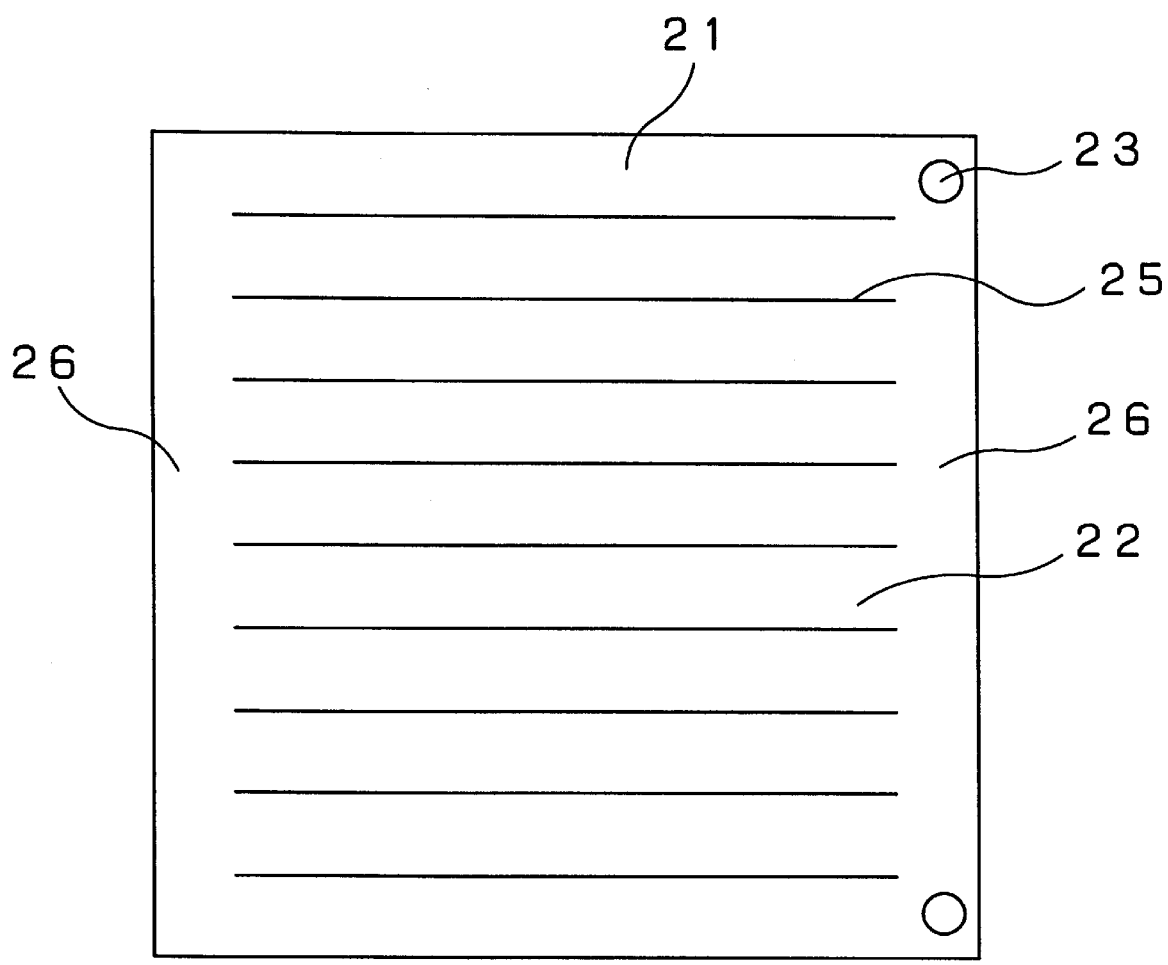
FIG. 3 is a plan view of the master substrate during the process of Embodiment 1 of the present invention.

A plurality of slits 25, each extending along a row of the sub substrates 22 at both side edges, are then provided by dicing in the master substrate 21 as shown in FIG. 3. At the time, the rows of the sub substrates 22 are linked to two connector regions 26 at both edges of the master substrate 21 as grouped in a work sheet, hence being prevented from separating from each other. A technique of fabricating such work sheets is disclosed in more detail in Japanese Patent Application Publication (Hei)8-22094. The slits 25 may be provided in the form of grooves which can electrically isolate signal terminals on the sub substrates 22. If the slits are grooves, the rows of the sub substrates 22 have to be separated at side edges from each other by an additional process.

Figure 4:
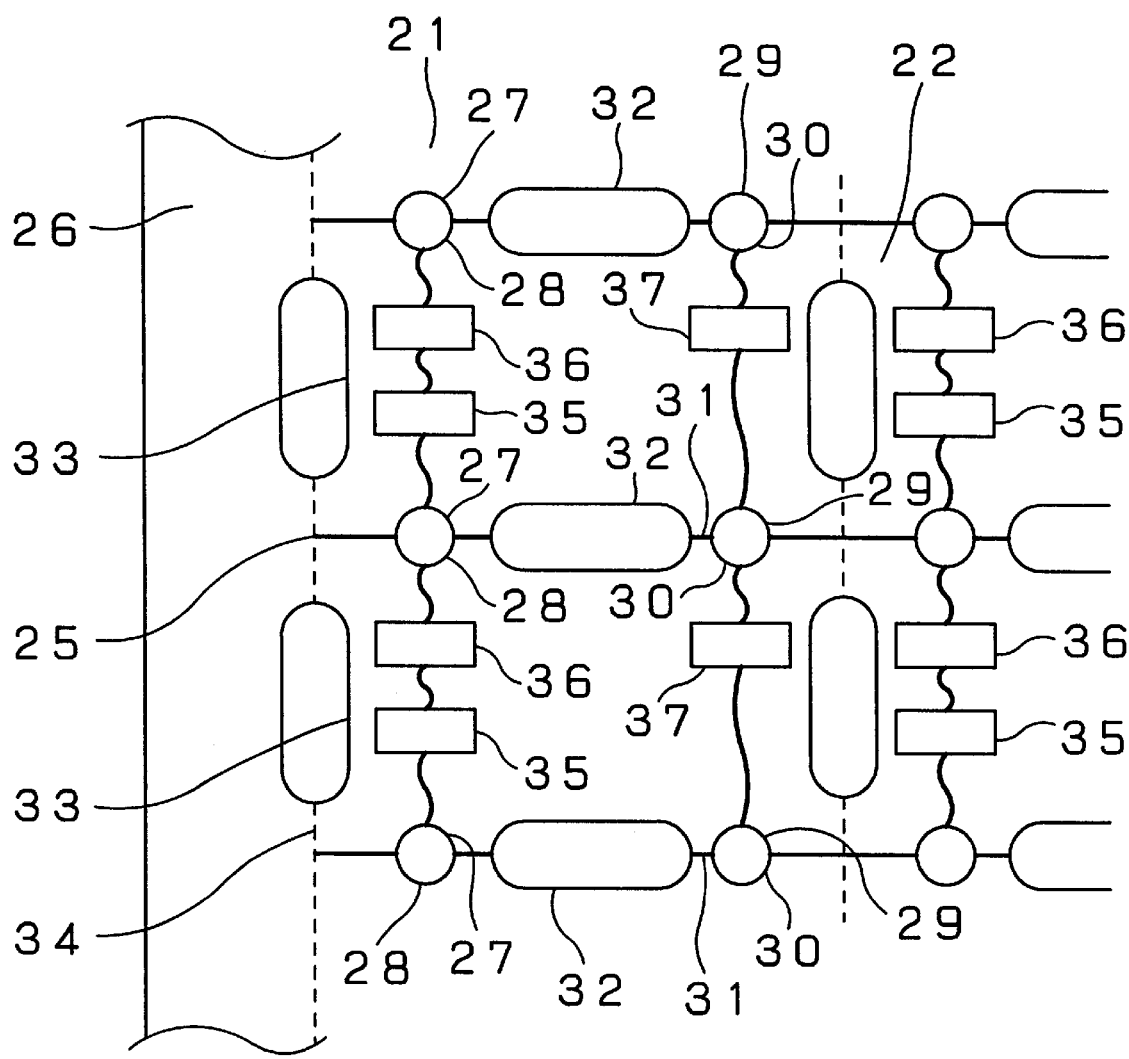
FIG. 4 is a plan view of a primary part of the master substrate according to Embodiment 1 of the present invention.

FIG. 4 is a plan view showing a primary part of the master substrate 21. As shown in FIG. 4, the sub substrates 22 of a rectangular shape are joined to each other in the rows on the master substrate 21 and each row of the sub substrates 22 is linked at both ends to the connector regions 26 at longitudinal end edges of the master substrate 21.

Signal terminals 27, 28, 29, and 30 are provided on the side edges 31 of each the sub substrate 22. Also, grounding terminals 32 are provided on the side edges 31 while grounding terminals 33 are provide on both longitudinal end edges 34 of the sub substrate 22. The signal terminal 27 may be connected to a first circuit 35 which is in turn connected by a second circuit 36 to the signal terminal 28. The signal terminal 29 may be connected by a third circuit 37 to the signal terminal 30.

Figure 5:
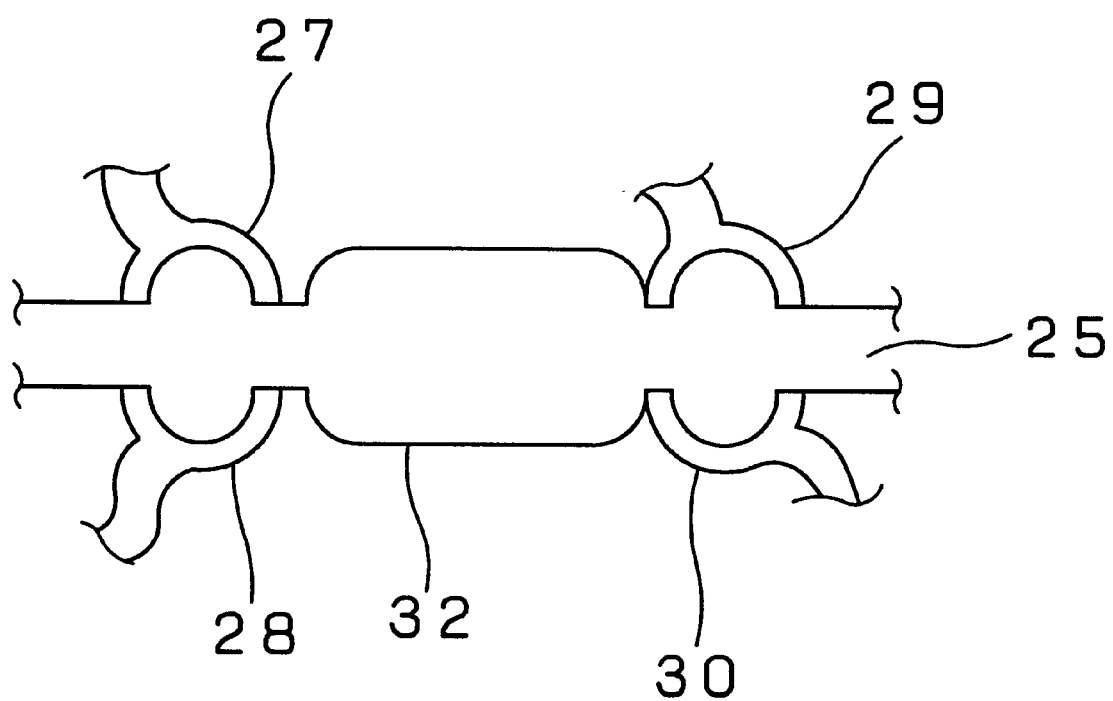
FIG. 5 is a partially enlarged view of a sub substrate on the master substrate according to Embodiment 1 of the present invention.

A number of slits 25 extending along the side edges 31 of the sub substrates 22 are provided by dicing in the master substrate 21 to electrically isolate the signal terminals 27 and 28 on one of any two adjacent sub substrates 22 from the signal terminals 29 and 30 respectively on the other. Since the sub substrates 22 are electrically isolated from each other at their side edges 31, their signal terminals 27, 28, 29, and 30 can separately be fed with a signal for operating each VCO with the sub substrates 22 linked to the connector regions 26 of the master substrate 21. The slits 25 may be provided in the form of not only a slit but also a groove. At the latter case, the sub substrates 22 have to be separated from each other by cutting along the grooves. FIG. 5 is an enlarged view showing a section between the two adjacent substrates 22.

Figure 6:
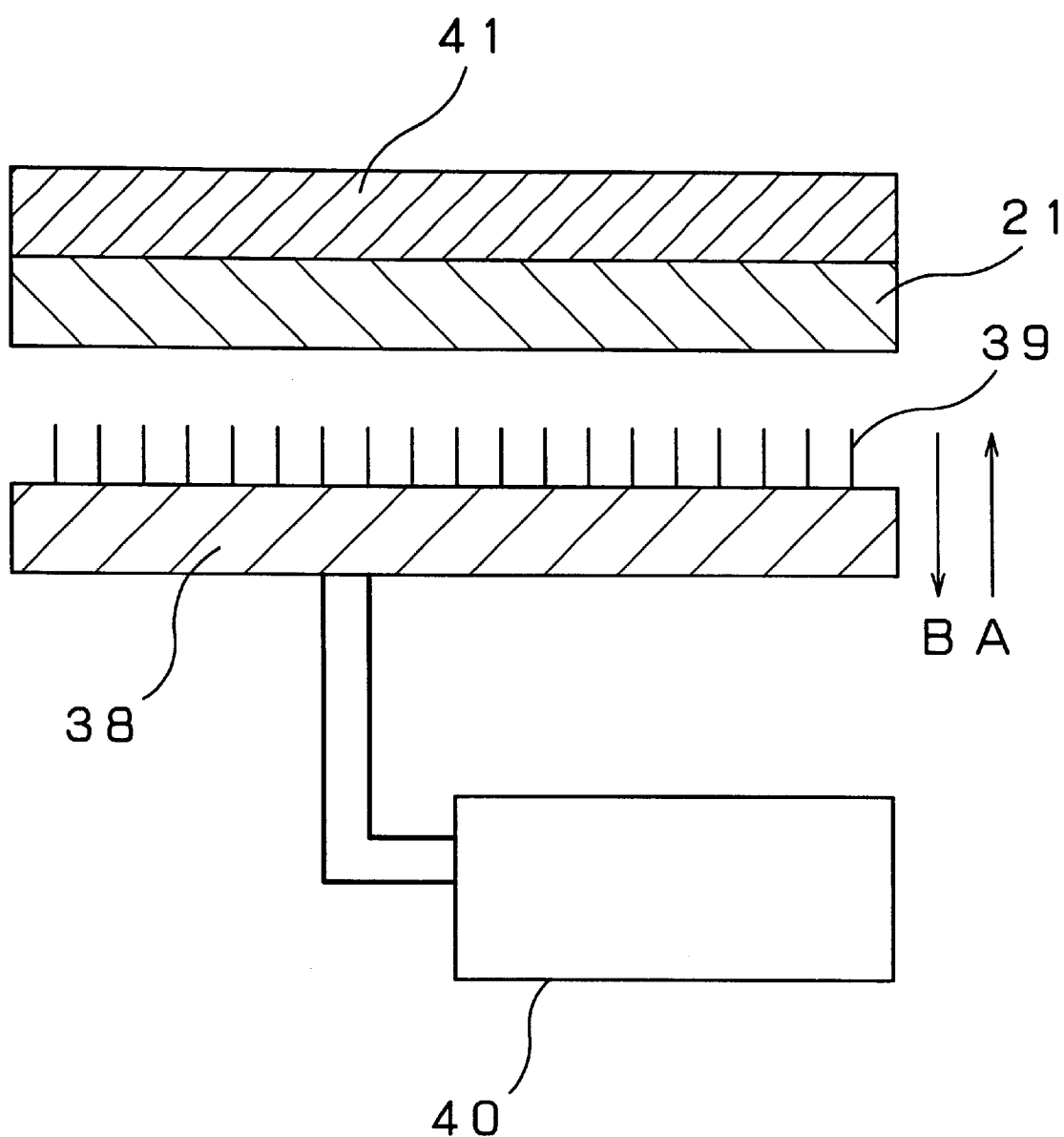
FIG. 6 is an explanatory view of an inspection apparatus according to Embodiment 1 of the present invention.

FIG. 6 illustrates an inspection apparatus applied for carrying out a first inspection. As shown in FIG. 6, a group of pins 39 are implanted onto a pressing platen 38 as urged upwardly by a spring, and connected to an inspection apparatus body 40 for signal application. The rows of the sub substrates 22 are joined to each other on the master substrate 21. As the pressing platen 38 is lifted up and down in two directions A and B, the pins 39 moves directly to and from the signal terminals 27, 28, 29, and 30 on the sub substrate 22 of a row. When the pins 39 stay in contact with the signal terminals, the signal is applied for operating the VCO on each of the sub substrates 22 and permits the frequency to be adjusted to a desired rate by laser trimming the pattern of inductance.

Also, a platform 41 having its lower surface arranged linearly for accepting the pins 39 at a time is placed over the row of the sub substrates 21. As the sub substrates 22 are pressed down by the platform 41 and prevented from being deflected due to the slits 25 in the master substrate 21, their terminals 27, 28, 29, and 30 can securely remain in direct contact with the pins 39. More particularly, while the platform 41 be downwardly urged by a plunger, the pins 39 are upwardly urged by the spring and their direct contact with the signal terminals 27, 28, 29, and 30 can thus be undertaken. The above structure of the inspection apparatus may be turned upside down. In this manner, after the first row of the sub substrates 22 is inspected, the next row shall be inspected by the same manner. This action will be repeated.

It is arranged for stable, no error application of the signal that specific or grounding ones of the pins 39, so called grounding pins, come at the earliest in contact with and depart at the latest from the signal terminals.

Although the sub substrates 22 connected to the pins 39 are fed one by one with the signal for carrying out the functional inspection and the frequency adjustment with laser trimming as described above, a few or several of them may be fed at once for increasing the efficiency. The use of the pins 39 results in dents developed by the pins 39 in the identical locations and to the identical depth on each of the high-frequency modules produced with such an inspection apparatus as used in this embodiment of the present invention.

Figure 7:
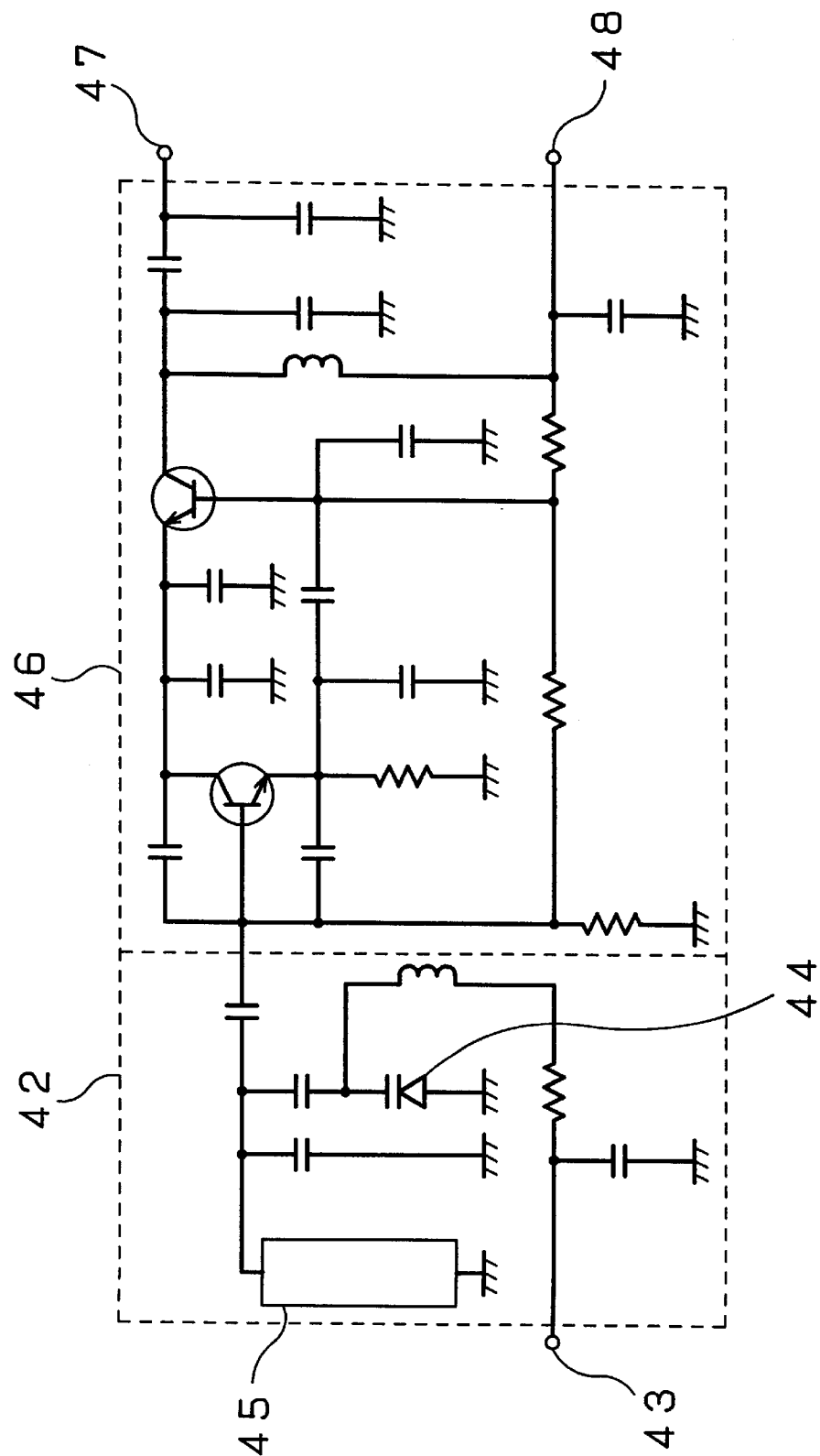
FIG. 7 is a circuitry diagram showing a VCO as the high-frequency module according to Embodiment 1 of the present invention.

FIG. 7 is a diagram of a VCO circuit of the high-frequency module. As shown in FIG. 7, a resonant circuit 42 controls the capacitance of a variable capacitance diode 44 to adjust the resonant frequency to a desired rate using a signal received through its control signal input port 43. An inductor 45 is pattern fabricated and its inductance can thus be varied by laser trimming to determine the resonant frequency of the circuit. The resonant circuit 42 is connected to an oscillator circuit 46 having an oscillation output port 47. The VCO circuit is supplied with power through its power input port 48. Referring now to FIG. 4, the control signal input port 43 is identical to the signal terminal 27, the oscillation output port 47 to the signal terminal 28, and the power input port 48 to the signal terminal 29. The signal terminal 30 is grounded.

Figure 8:
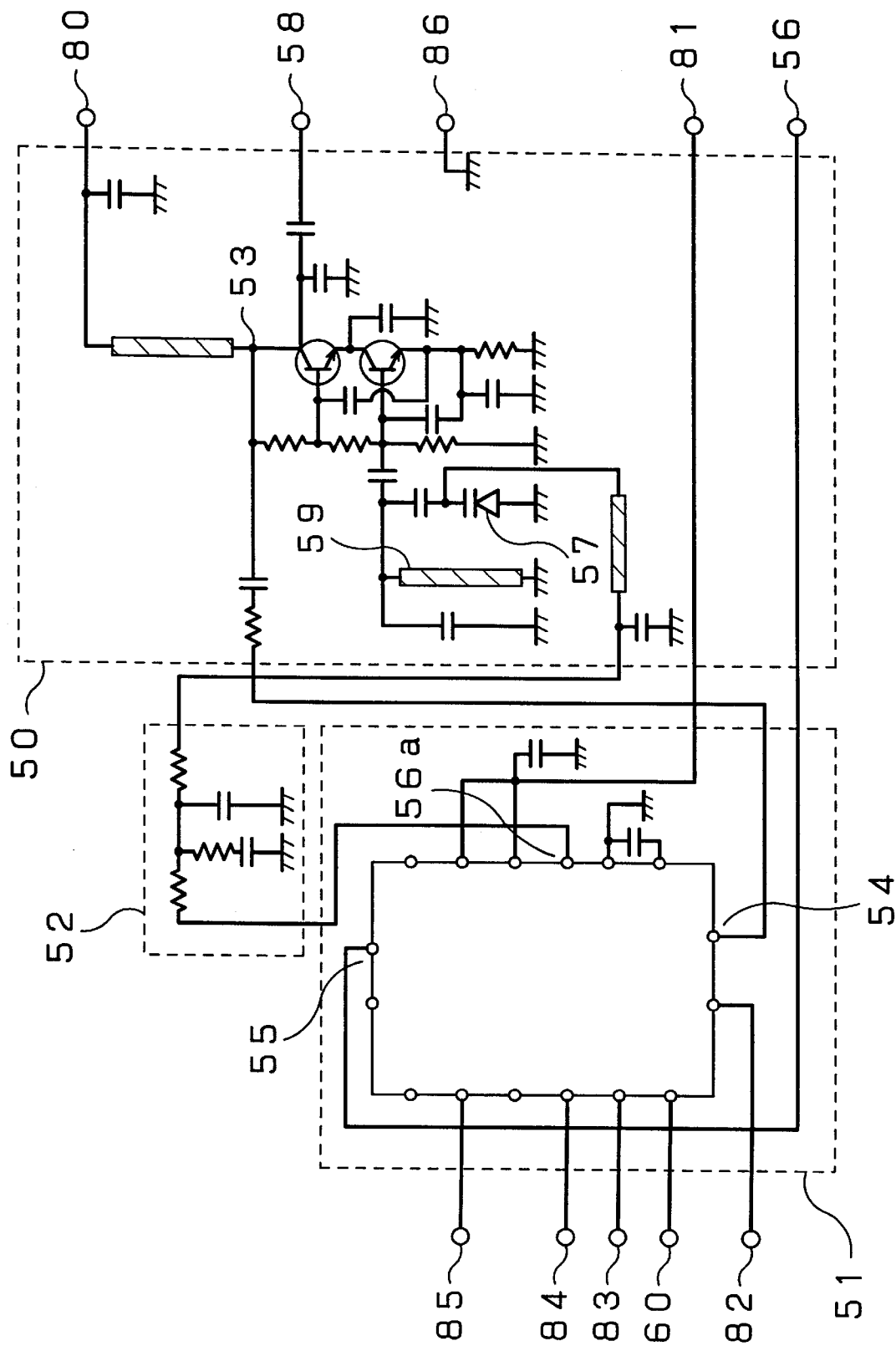
FIG. 8 is a circuitry diagram showing a VCO/PLL as the high-frequency module according to Embodiment 1 of the present invention.

FIG. 8 is a diagram of a VCO/PLL circuit of the high-frequency module. As shown in FIG. 8, the module comprises a VCO circuit 50, a PLL circuit 51, and a low-pass filter 52. An output 53 of the VCO circuit 50 is connected to one 54 of two inputs of the PLL circuit 51 of which the other input 55 is connected to a signal terminal 56 through which a reference frequency from a quartz oscillator is received. An output 56a of the PLL circuit 51 is connected via the low-pass filter 52 to a variable capacitance diode 57 which is a resonant circuit in the VCO circuit 50. Another output 53 of the VCO circuit 50 is connected through a signal terminal 58. An inductor 59 is pattern fabricated and its inductance for a resonant circuit can thus be determined by laser trimming.

In the VCO/PLL having the arrangement described above, the capacitance of the variable capacitance diode 57 is varied by a data signal received through a signal terminal 60 to adjust the oscillator output frequency to a desired rate which is then released from a signal terminal 58. This arrangement has a more number of the signal terminals exposed at the side edges 31 of the sub substrate 22 than the VCO circuit shown in FIG. 7. It is essential that the signal terminals (including 80 to 85) are all provided at the side edges of the module. A grounding terminal 86 may be provided at an end edge of the module. It is noted that signal terminals other than the grounding terminal 86 may be provided on the longitudinal end edges of each module according to Embodiment 2.

Figure 1:
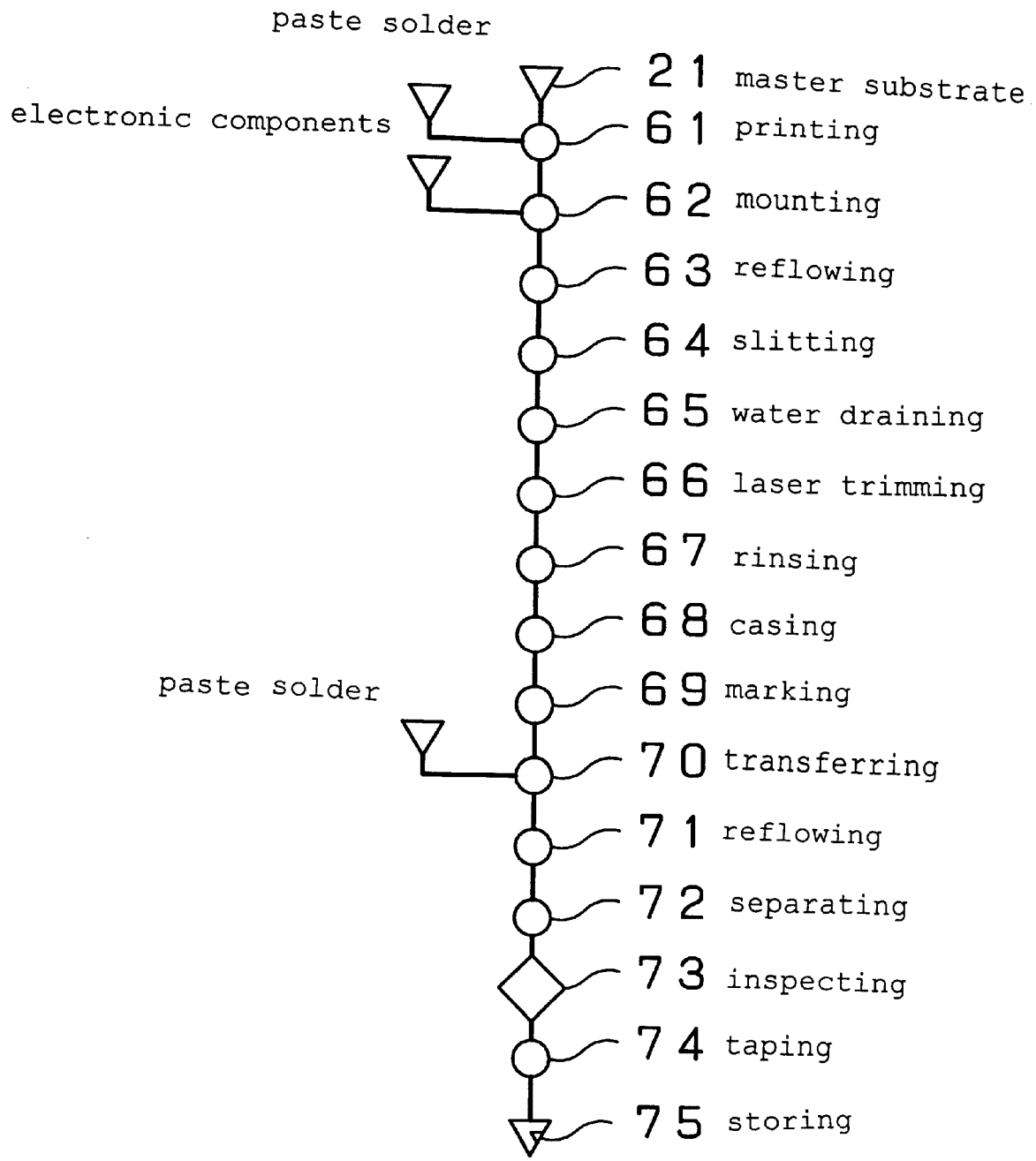
FIG. 1 is a process diagram of the method of producing high-frequency modules illustrating Embodiment 1 of the present invention.

A procedure of producing the high-frequency modules will now be explained referring to FIG. 1. The procedure starts with printing, at 61, a pattern of paste solder on the master substrate 21 of a worksheet form on which rows of the sub substrates 22 are plotted. This is followed by mounting electronic components at 62 and reflowing the solder to secure the electronic components to the sub substrates 22 at 63. Then, dicing is carried out at 64 to provide the slits 25 along the side edges 31 of the sub substrates 22. As the result, the signal terminals of any two adjacent sub substrates 22 are electrically isolated from each other. Water used in the dicing is then drained at 65. This is followed by, at 66, feeding the sub substrates 22 with a power supply through their corresponding pins 39 and conducting a laser trimming action to adjust the frequency while the oscillator frequency is monitored on the inspection apparatus body 40. This step 66 incorporates a first inspection. This is followed by rinsing at 67, covering with shielding cases at 68, and marking the shielding cases at 69. A pattern of paste solder is then transferred at 70 and reflowed at 71 to secure the shielding cases to their respective sub substrates. Until the procedure goes to the step 71, the master substrate 21 remains in its worksheet form, hence contributing to the improvement of the production efficiency.

Then, the sub substrates 22 are separated from the master substrate 21 at 72. The separated sub substrates 22 are subjected to a (second) inspection such as, for example, inspecting their final electrical characteristics at 73 before they are completed as the VCO modules. The VCOs are then saved on a tape at 74 and stored at 75.

(Embodiment 2)

In Embodiment 2, the second inspection for conducting mainly an electrical inspection is performed before the separation of the sub substrates 22 as compared with after the separation of the sub substrates 22 in Embodiment 1. For this purpose, the first step of a procedure is provided for electrically isolating any two adjacent sub substrates of each row from each other by cutting along their longitudinal end edges crosswise of the sub substrates. This is followed by a second step for electrically isolating any two adjacent rows of the sub substrates by cutting along their side edges. As the result, the sub substrates are electrically separated from each other. Accordingly, resultant high-frequency modules can be inspected while they are still held on the master substrate of a worksheet form before the sub substrates are completely separated from each other, hence significantly increasing their productivity.

Figure 9:
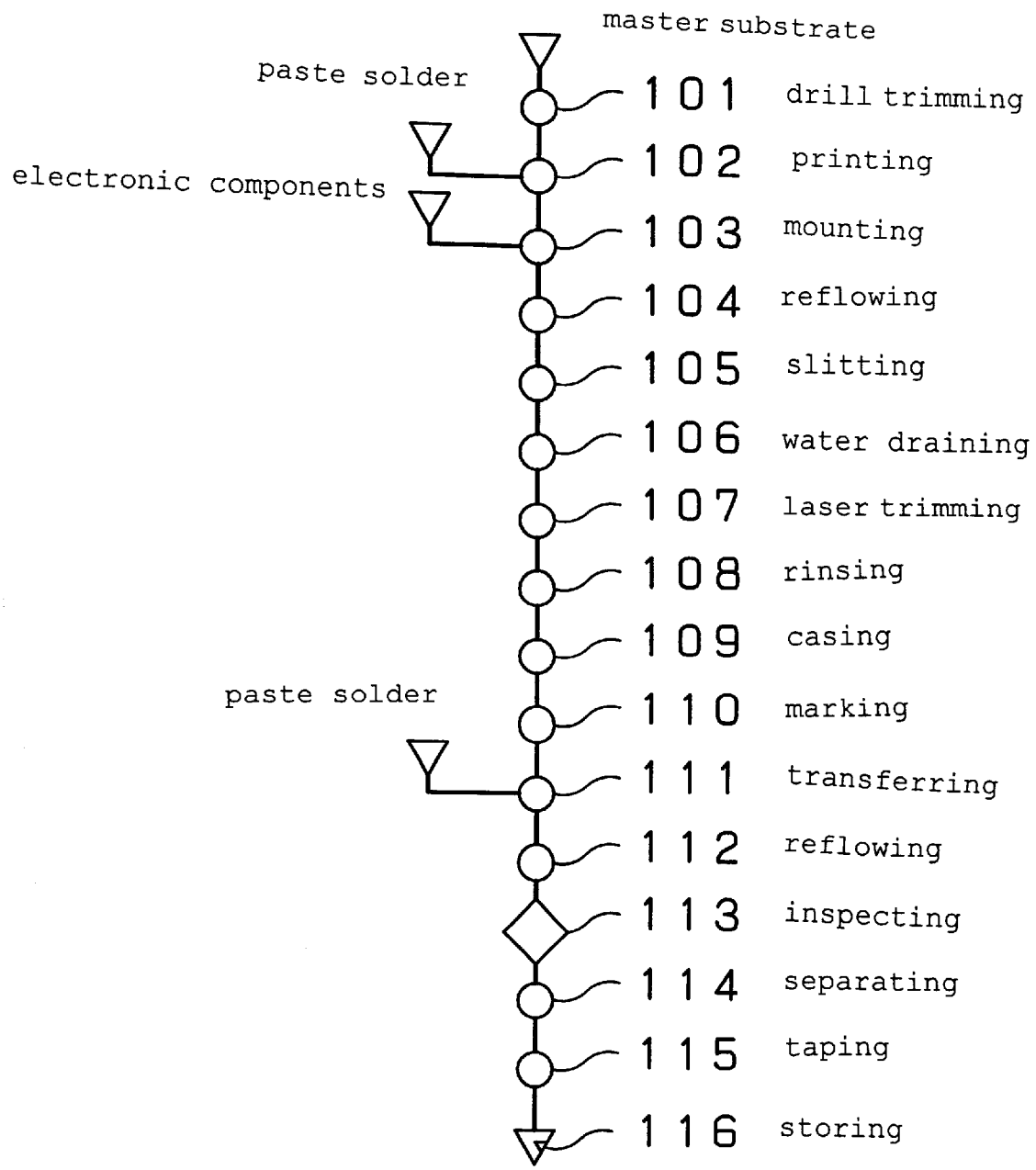
FIG. 9 is a process diagram of the method of producing high-frequency modules illustrating Embodiment 2 of the present invention.

A procedure of the production, as shown in FIG. 9, starts with preparing the master substrate. The master substrate is identical to that described with Embodiment 1 and has substantially a rectangular configuration. Rows of the sub substrates are plotted on the master substrate. The preparation of the master substrate is followed by trimming the master substrate at 101 to electrically separate any two adjacent sub substrates of each row (i.e. cutting along their longitudinal end edges). This step may be carried out by making electrical disconnections while contemplating a pattern of sub substrates on the master substrate. A technology of the electrical disconnections will be described later in more detail referring to FIGS. 10 and 11.

Then, a step at 102 for printing a pattern of paste solder on the master substrate follows. After the paste solder is printed at 102, electronic components are mounted at 103 and passed through a reflow furnace at 104 for securing to the sub substrates.

Dicing is then conducted at 105 for having slits along the side edges of the sub substrates. This allows the signal terminals of any two adjacent sub substrates to be electrically isolated from each other along their side edges. Water used in the dicing is then drained at 106.

Then, the sub substrates are fed with a power supply through pins of an inspection tooling and laser trimmed at 107 to adjust the frequency while monitoring the oscillator frequency with an inspection apparatus. This step 107 incorporates a first inspection.

This is followed by rinsing at 108, covering with shielding cases at 109, and marking the shielding cases at 110. A pattern of paste solder is transferred at 111 and reflowed at 112 for securing the shielding cases to their respective sub substrates. Finally, a second inspection 113 is conducted for examining the electrical characteristics.

The sub substrates are then separated from the master substrate at 114. The separated sub substrates are finished VCO modules which are saved on a tape at 115 and stored at 116. The procedure up to the second inspection at 113 is carried out with the sub substrates held on the master substrate of a worksheet form, hence increasing its operating efficiency.

Figure 10:
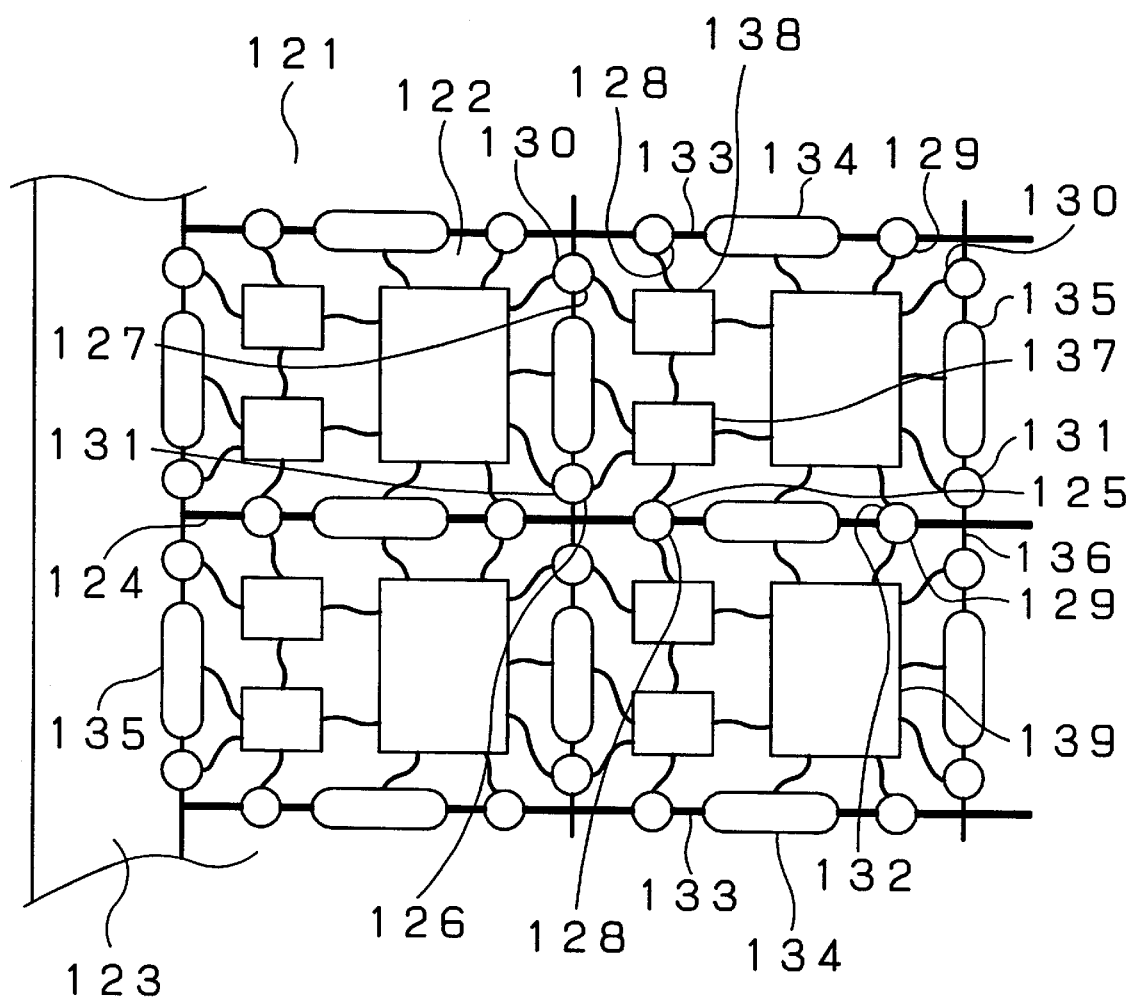
FIG. 10 is a plan view of a primary part of the master substrate according to Embodiment 2 of the present invention.

FIG. 10 is a plan view of a primary part of the master substrate 121 according to Embodiment 2. The sub substrates 122 are provided in rows on the master substrate 121 as described with Embodiment 1. There are slits 124 provided in the master substrate 121 by dicing thus forming connector regions 123. The slits 124 are arranged for electrically isolating any two adjacent rows of the sub substrates 122 from each other at their signal terminals and may be in the form of not only a slit but also a groove. In the latter case, the rows of the sub substrates 122 have to be physically cut along the grooves or their side edges.

As shown in FIG. 10, signal terminals 125 to 132 are provided on both side edges 133 and longitudinal end edges 136 of each the sub substrates 122. Also, a grounding terminal 134 is provided on each side edge 133 while a grounding terminal 135 is provided on each end edge 136. The signal terminal 125 may be connected a first circuit 137 in the pattern which is in turn connected by a second circuit 138 to the signal terminal 128. The signal terminals 130 may be connected by a third circuit 139 to the signal terminal 131.

As the slits 124 are provided by dicing extending along the side edges 133 of the sub substrates 122, the signal terminals 125 and 128 are isolated from each other electrically and mechanically.

Figure 11:
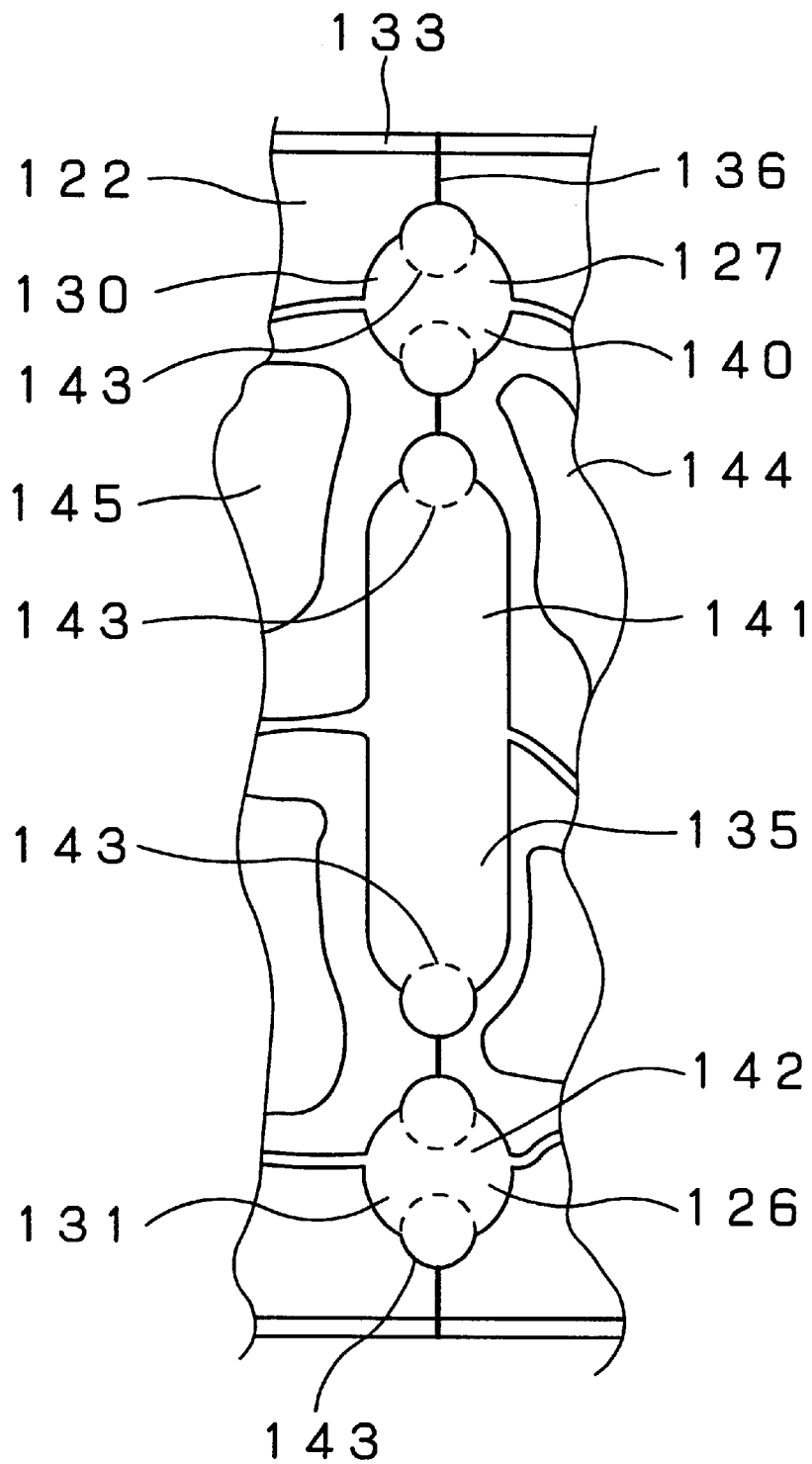
FIG. 11 is a partially enlarged view of a sub substrate on the master substrate according to Embodiment 2 of the present invention.

FIG. 11 is an enlarged view of a joint section along the longitudinal end edge 136 between the two adjacent sub substrates 122. Cutouts 143 at both sides of each of holes 140, 141, and 142 are provided across the longitudinal end edges 136 using an end mill to electrically isolate along the longitudinal end edge 133 between any two longitudinally adjacent sub substrate 122 of each row. There are also shown a couple of identical patterns 144 and 145 on their respective two adjacent sub substrates 122. The two patterns 144 and 145 are physically separated by the longitudinal end edge 136 and thus electrically isolated from each other. This permits the two patterns 144 and 145 to be identical to each other in the high frequency characteristic as fed with uniform signals. More specifically, their electrical characteristics remain intact.

The sub substrates 122 can be separated from each other at 114 by cutting along their longitudinal end edges 136 with a cutter. The longitudinal end edges 136 may be scored in a V groove form for ease of cutting.

The sub substrates 122 on the master substrate 121 are electrically isolated from each other at the side edges 133 and the longitudinal end edges 136. Hence, the signal terminals 125 to 132 of each the sub substrate 122 are electrically isolated from those of any adjacent sub substrate 122. While the sub substrates 122 linked to the connector regions 123 of the master substrate 121 remain physically joined to each other (in a worksheet form), their signal terminals 125 to 132 can be fed with a signal to actuate and examine their VCO circuits under the same conditions as for testing a separated VCO module. Other features identical to those of Embodiment 1 will be explained in no more detail.

Figure 12:
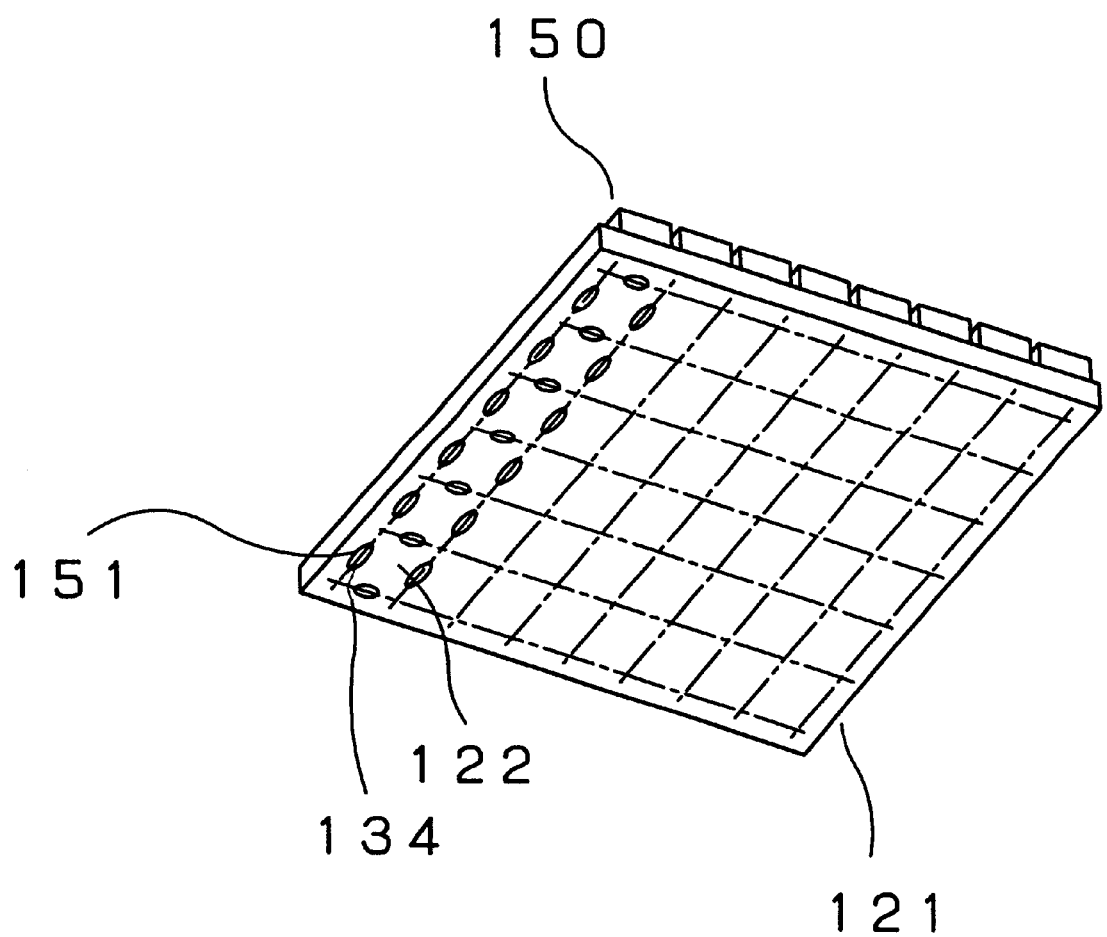
FIG. 12 is a perspective view of the master substrates covered with shielding cases according to Embodiment 2 of the present invention.
Figure 13:
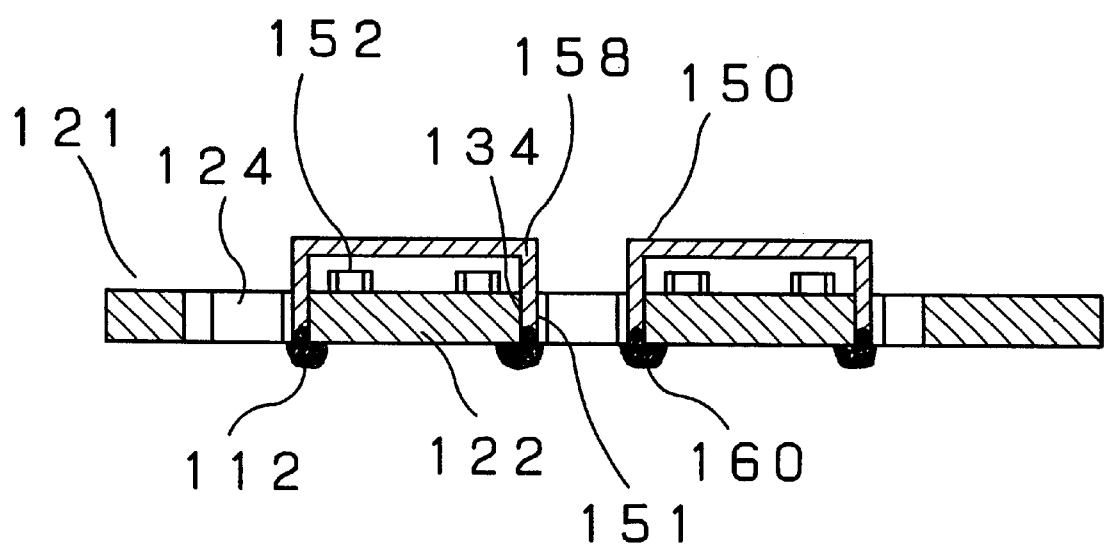
FIG. 13 is a primary cross sectional view showing Embodiment 2 of the present invention.

Steps of covering the sub substrates 122 with shielding cases 150 respectively and marking the shielding cases 150 will now be described. The two steps are identical to those explained with Embodiment 1. FIG. 12 is a perspective view showing the sub substrates 122 on the master substrate 121 covered with their respective shielding cases 150. As shown, each grounding terminal 134 on the side edge 133 of the sub substrate 122 has a leg 151 joined thereto by reflow soldering. FIG. 13 is a cross sectional view of the same. More particularly, the legs 151 extending from the shielding case 150 are (reflow) soldered by paste solder 160 to the grounding terminals 134 of the sub substrate 122 exposed to the slits 124 in the master substrate 121. A set of electronic components 152 are mounted on to the sub substrate 122 as illustrated.

Figure 14:
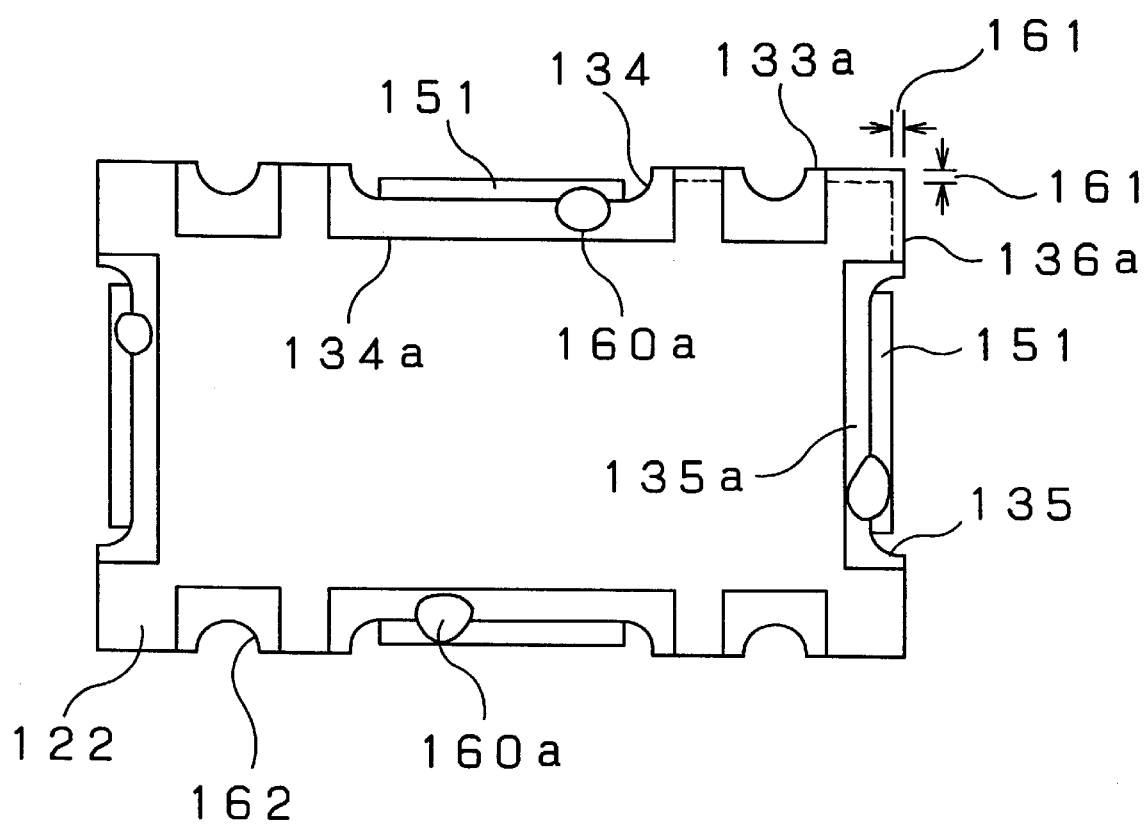
FIG. 14 is a plan view of the high-frequency modules covered with their respective shielding cases according to Embodiment 2 of the present invention.

FIG. 14 is a plan view of the high-frequency module fabricated by covering the sub substrate 122 with the shielding case 150 by soldering. As shown in FIG. 14, cutout edges 133a extend along the side edges 133 of the sub substrate 122 while cutout edges 136a extend along the longitudinal end edges 136. According to this embodiment, a margin 161 of 0.07 to 0.15 mm is provided between the cutout edges 133a, 136a and the legs 151 of the shielding case 150. This allows the cutout edges 133a and 136a to be outwardly distanced by the margin 151 from the legs 15 on the edges of the shielding case 150. Accordingly, during the separation of the sub substrates 122 from the master substrate 121, the shielding cases 150 can be protected from being injured by the cutter. If the margin is too small, the cutter may hit and injure the edges of the shielding cases 150. Increasing the margin may result in the bulky overall dimensions. The signal terminals are denoted at 162.

Also, while the master substrate 121 is in its worksheet form, the shielding cases 150 are provided and a pattern of paste solder 160 is transferred on to the back side of the master substrate 121. Accordingly, remainings 160a of the solder 160 are left on the bottom sides 134a and 135a of the grounding terminals 134 and 135 when the soldering step 112 is completed.

In this manner, the legs 151 of the shielding case 150 are soldered at 112 to the grounding terminals 134 and 135. Since the cutout edges 133a and 136a of the sub substrate 122 are outwardly distanced from the legs 151, any external stress exerted during the cutting may rarely injure or crack the solders 160a joining the grounding terminals 134 and 135 to the legs 151.

Another modification for improving the relationship between the shielding case 150 and the sub substrate 122 will now be explained. When the shielding case 150 is roughed at its surface, its overall surface area increases hence promoting the radiation of heat derived from particular components of the sub substrate 122. For this purpose, the rough sides of the shielding case 150 are implemented by the movement of a dedicated dicing cutter which runs along the slits 124 to profile the side edges 133 of the sub substrates 122.

As the shielding case 150 is increased in the overall surface area, its radiation of heat will be improved. Also, the cutout edges 133a of the sub substrate 122 never extend outwardly from the sides of the shielding case 150 thus contributing to the compact size of the module. Moreover, the rough sides are simultaneously provided during the separation of the sub substrates 122 by dicing, eliminating the need of a separate roughing step. The rough sides may be provided at full four sides or may be provided at one side. The top of the shielding case 150 is not roughed hence not disturbing the appearance.

Figure 15:
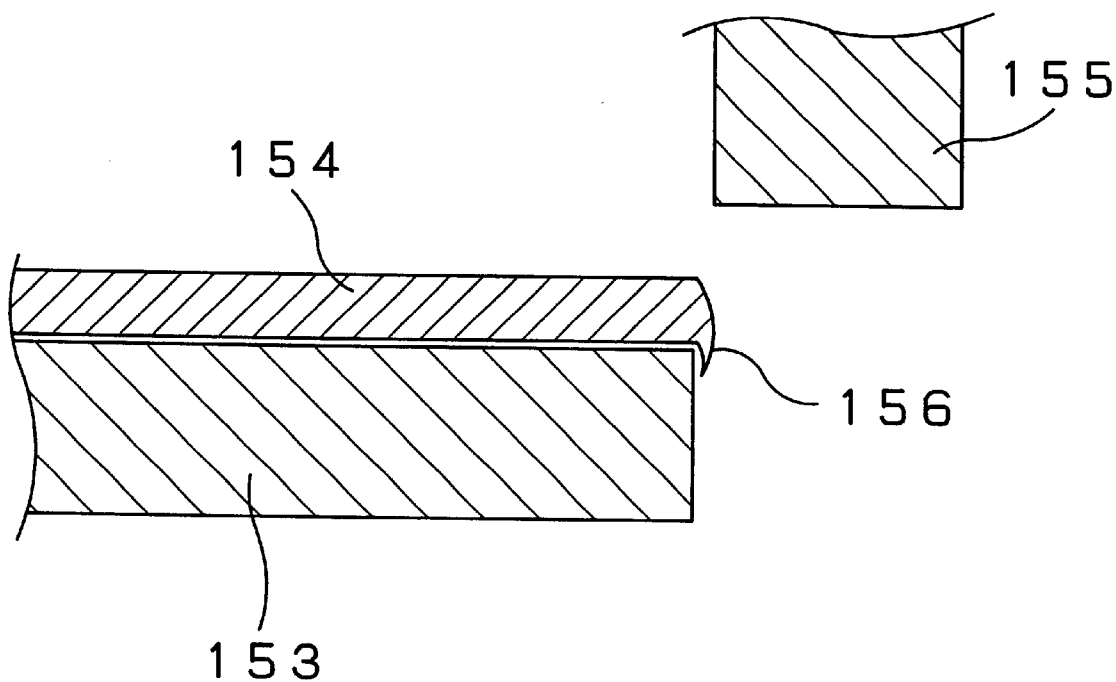
FIG. 15 is a primary cross sectional view of a shielding case forming dies according to Embodiment 2 of the present invention.

Also, for fabricating the shielding case 150, a sheet of metal 154 (a tin-plated steel sheet) is placed on a die 153 and punched by a punch 155 lowering rapidly, as shown in FIG. 15. At the time, a burr 156 is created on an edge of the metal sheet 154.

Figure 16:
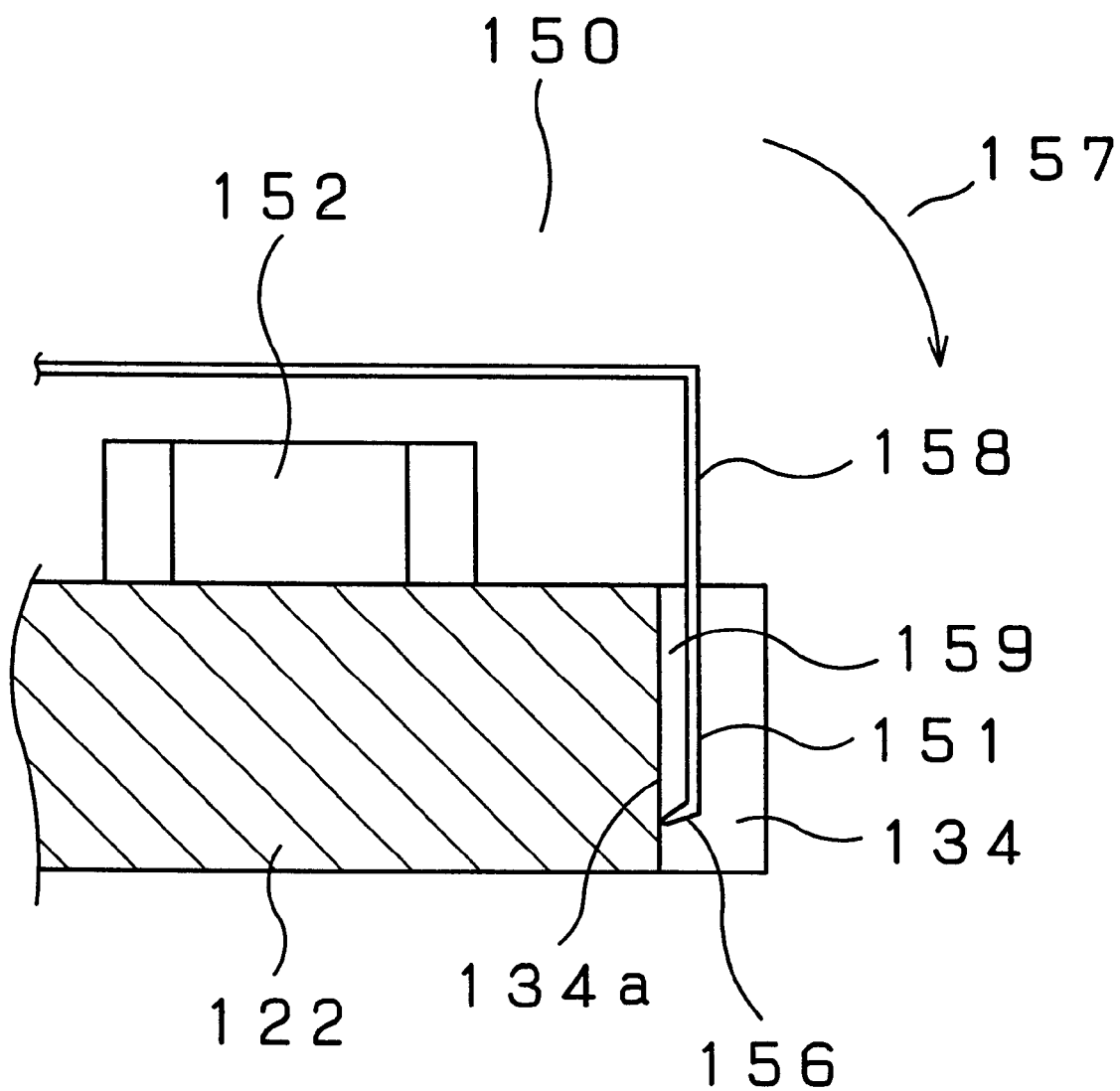
FIG. 16 is a primary cross sectional view of the high-frequency modules covered with their respective shielding cases according to Embodiment 2 of the present invention.
Figure 17:
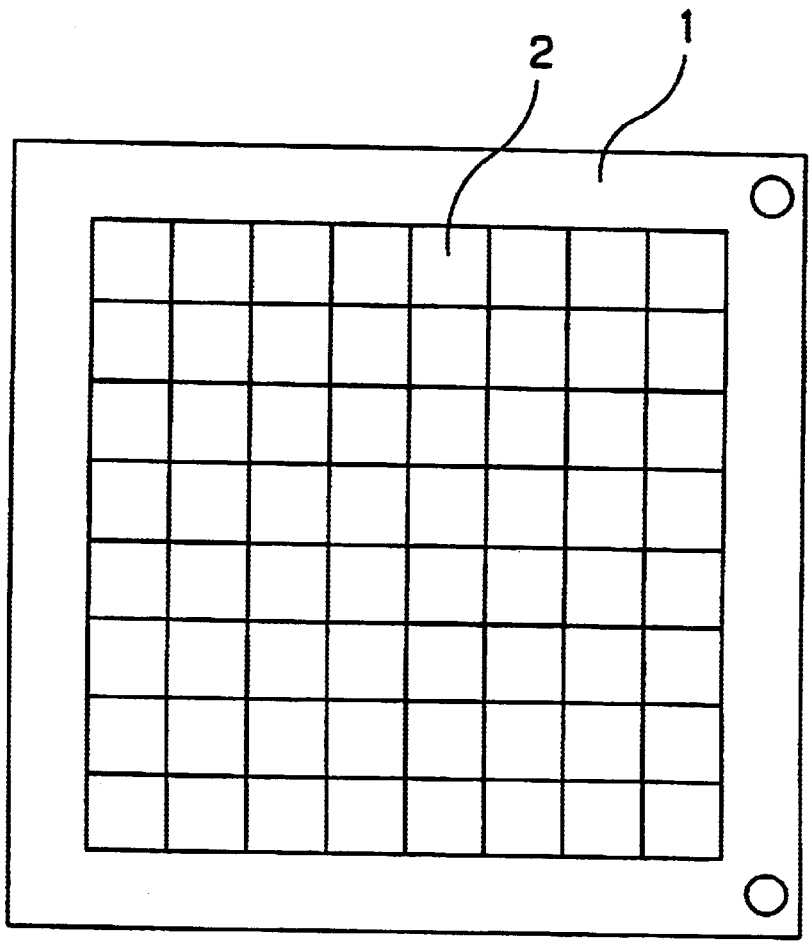
FIG. 17 is a plan view of a master substrate on which high-frequency modules are fabricated according to a conventional method.
Figure 18:
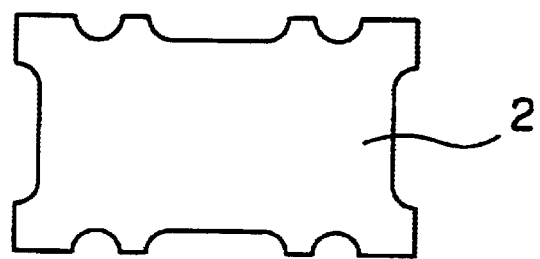
FIG. 18 is a plan view of a sub substrate from which the high-frequency module is fabricated according to the conventional method.
Figure 19:
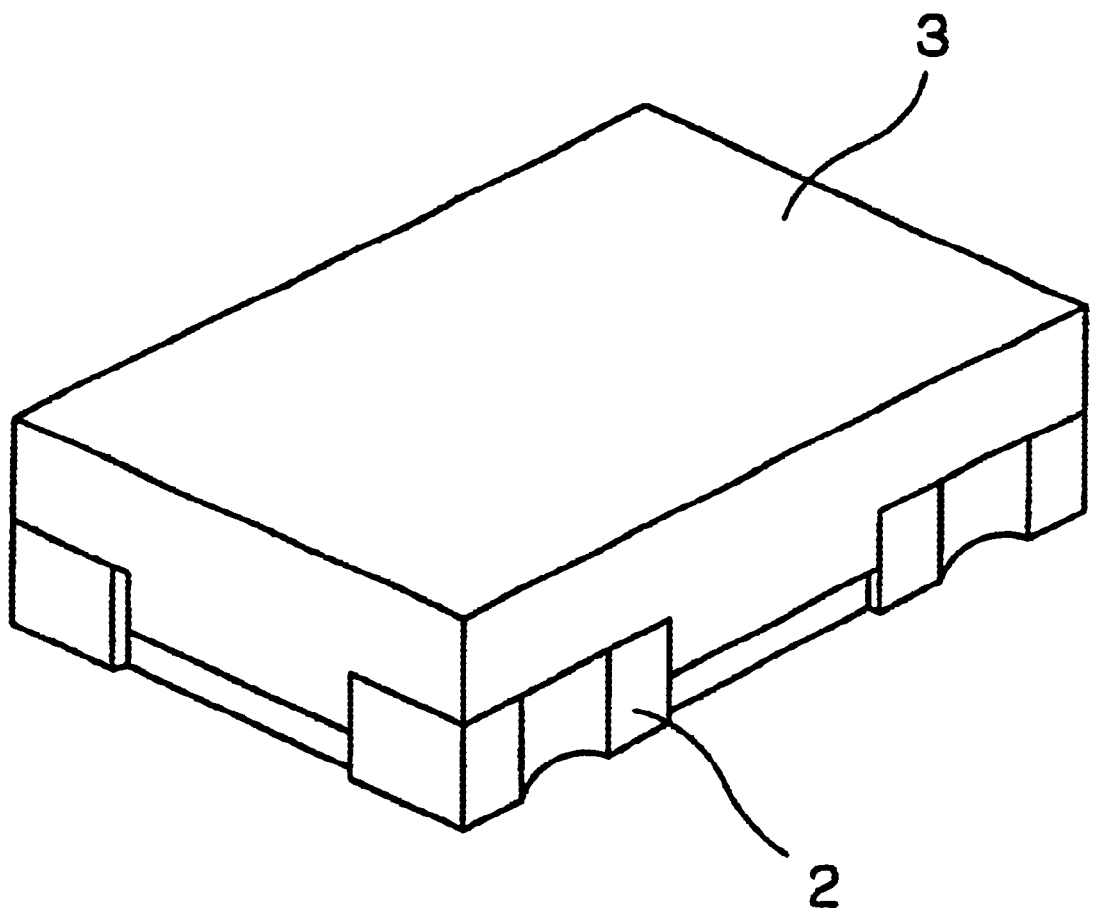
FIG. 19 is a perspective view of the high-frequency module according to the conventional method.
Figure 20:
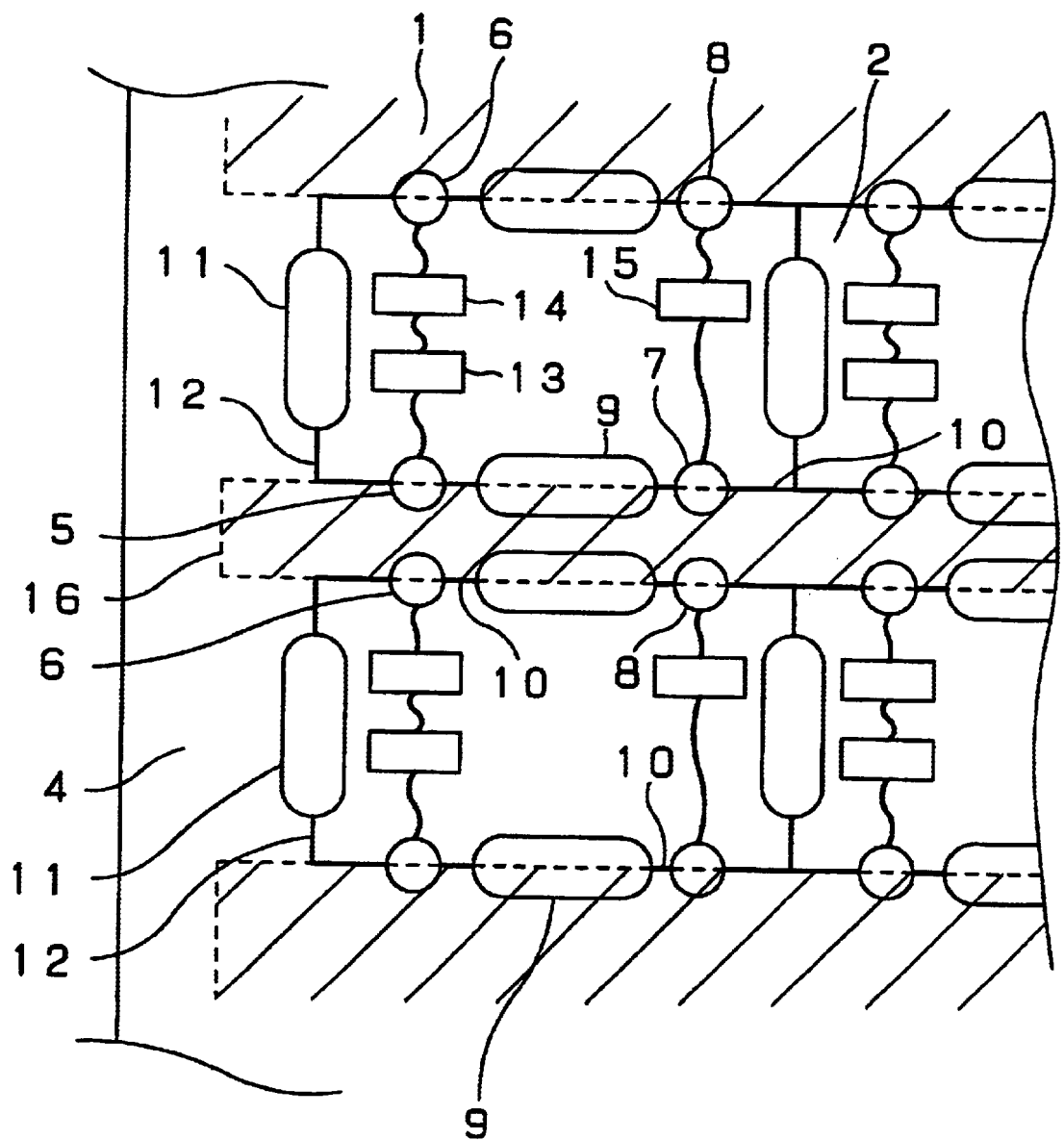
FIG. 20 is a primary plan view of the master substrate on which the high-frequency are fabricated according to the conventional method.

Then, the metal sheet 154 is then bent in the direction of punching 157 to form a bend 158, as shown in FIG. 16. Lower portions of the bend 158 incorporate the legs 151 and the shielding case 150 is completed. The shielding case 150 is then engaged with the grounding terminals 134 of the sub substrate 122. The burr 156 generates a gap 159 between the edge 134a of each grounding terminal 134 and the corresponding leg 151. The gap 159 allows the paste solder to run extensively due to the effect of capillary action when is melted by reflowing heat. The burr 156 extends inwardly but not outwardly towards the neighbor sub substrate 122, hence permitting the distance between the two adjacent sub substrates 122 to be minimized. The outer side of the high-frequency module burr 156 offers safety when it is touched by the finger.

The shielding case 150 is then marked down on its top side. The marking can be made at one over the modules of a worksheet form, thus being increased in the efficiency. The marking is favorably conducted using a laser beam. This allows the marking to be hardly varied in quality from one location to another, ensuring the better finish of the marking. Moreover, the laser beam can apply markings on the modules of a smaller size at a higher speed. The markings applied using the laser beam will hardly be erased by the fingers.

As set forth above, the method of producing high-frequency modules according to the present invention comprises: a first step of fabricating, on a master substrate, a plurality of sub substrates linked to connector regions at both ends of the master substrate, each of the sub substrates formed of substantially a four-side shape and having an identical pattern of circuit developed thereon, providing on both side edges of the sub substrate, a set of signal terminals connected to a first circuit so that the signal terminals at each side edge are formed integral with other signal terminals provided on the corresponding side edge of the neighbor sub substrate and connected to a second circuit, and mounting electronic components on the sub substrate; a second step of, after the first step, electrically isolating the signal terminals at each side edge of the sub substrates from the other signal terminals at the corresponding side edge of the neighbor sub substrate while the connector regions of the master substrate remain linked to the sub substrates; a third step of, after the second step, conducting a first inspection with pins of an inspection tooling engaged in direct contact with the signal terminals of the sub substrates; and a fourth step of, after the third step, separating the sub substrates from the master substrate by cutting along the longitudinal end edges of each of the sub substrates. As two sets of the signal terminals of any two adjacent sub substrates, the side edges are electrically isolated from each other at the second step, and the sub substrates are processed in a worksheet form up to the third step. After the third step, the sub substrates are then separated from each other. The productivity in the method can thus be improved significantly without using such additional steps as of any conventional method for separating the modules and then aligning them again for the inspection.

The sub substrates can be separated from each other by directly cutting the signal terminals provided on their side edges but not by punching out dummy portions with such a particular punch as in any conventional method. The method of the present invention will hence be minimized in the loss of materials hence contributing to the lower cost of the products.

What is claimed is:

1. A method of producing high-frequency modules comprising:

a first step of fabricating, on a master substrate, a plurality of sub substrates linked to connector regions at both ends of the master substrate, each of the sub substrates formed of substantially a rectangular shape and having an identical pattern of circuit developed thereon, providing on each of two side edges of the sub substrates, a set of signal terminals connected to a first circuit so that the set of signal terminals at each of the two side edges is formed integral with a set of signal terminals provided on a side edge of an adjacent sub substrate and is connected to a second circuit, and electrically isolating any two adjacent sub substrates from each other at their longitudinal end edges;

a second step of, after said first step, mounting electronic components on each of the sub substrates;

a third step of, after said second step, electrically isolating the signal terminals at each of the two side edges of the sub substrates from the signal terminals provided on the side edge of the adjacent sub substrate while the connector regions of the master substrate remain linked to the sub substrates;

a fourth step of, after said third step, conducting an inspection with pins of an inspection tooling engaged in direct contact with the signal terminals of the sub substrates; and a fifth step of, after said fourth step, separating the sub substrates from the master substrate by cutting along the longitudinal end edges of each of the sub substrates.

2. A method of producing high-frequency modules according to claim 1, wherein the electrical isolation of the signal terminals at said third step is implemented by providing slits.

3. A method of producing high-frequency modules according to claim 2, wherein said third step of electrically isolating the signal terminals at each of the two side edges of the sub substrates from the signal terminals provided on the side edge of the adjacent sub substrate while the connector regions of the master substrate remain linked to the sub substrates is followed by a step of covering the sub substrate with a shielding case.

4. A method of producing high-frequency modules according to claim 3, wherein the cutting edges of the sub substrate are created by cutting along the slits so as to extend more outwardly than the shielding case.

5. A method of producing high-frequency modules according to claim 3, wherein the cutting edges of the sub substrate are created by cutting along the slits so as to be substantially flush with sides of the shielding case.

6. A method of producing high-frequency modules according to claim 5, wherein the sides of the shielding case are more roughed on their surface than the top.

7. A method of producing high-frequency modules according to claim 6, wherein the sub substrates are separated from each other with the use of a rotary blade which is also adapted for roughing the sides of the shielding case.

8. A method of producing high-frequency modules according to claim 3, wherein the shielding case is fabricated by punching a sheet of material with dies, bending the sheet in the direction of punching to form bends, and soldering distal ends of the bends or legs to the grounding terminals provided on the side edges of the sub substrate.

9. A method of producing high-frequency modules according to claim 3, wherein the shielding case is marked down on its top side using a laser beam.

10. A method of producing high-frequency modules according to claim 1, wherein the electrical isolation of the signal terminals at said third step is implemented by providing grooves.

11. A method of producing high-frequency modules according to claim 1, wherein when the pins are moved to engage in direct contact at said fourth step, grounding pins are allowed to touch first and when disengaging, to depart last.

12. A method of producing high-frequency modules according to claim 1, wherein the inspection is to inspect a group of the sub substrates at once.

13. A method of producing high-frequency modules according to claim 12, wherein the inspection at said fourth step is conducted by pressing the pins against substantially identical locations on the signal terminals of each of the sub substrates and feeding the signal terminals with an electric signal.

14. A method of producing high-frequency modules according to claim 1, further comprising a sixth step of, after said fifth step of separating the sub substrates from the master substrate, mounting the separated sub substrates on a tape.

15. A method of producing high-frequency modules comprising:
a first step of fabricating, on a master substrate, a plurality of sub substrates linked to connector regions at both ends of the master substrate, each of the sub substrates formed of substantially a rectangular shape and having an identical pattern of circuit developed thereon, and mounting electronic components on each of the sub substrates;
a second step of, after said first step, covering each of the sub substrates with a metal shielding case while the sub substrates are in a worksheet form; and
a third step of, after said second step, separating the sub substrates from the master substrate by cutting along side edges of the sub substrates.

16. A method for producing high-frequency modules, said method comprising:
fabricating, on a master substrate, a plurality of sub substrates linked to connector regions at both ends of the master substrate, wherein each of the sub substrates has an identical pattern of circuit developed thereon, provided on each of two side edges of the sub substrates is a set of signal terminals connected to a first circuit so that the set of signal terminals at each of the two side edges is formed integral with a set of signal terminals provided on a side edge of an adjacent sub substrate and is connected to a second circuit, and any two adjacent sub substrates are electrically isolated from each other at their longitudinal end edges;
mounting electronic components on each of the sub substrates;
electrically isolating the signal terminals at each of the two side edges of the sub substrates from the signal terminals provided on the side edge of the adjacent sub substrate while the connector regions of the master substrate remain linked to the sub substrates;
conducting an inspection with pins of an inspection tool engaged in direct contact with the signal terminals of the sub substrates; and
separating the sub substrates from the master substrate by cutting along the longitudinal end edges of each of the sub substrates.

17. A method for producing high-frequency modules as claimed in claim 16, wherein said electrically isolating the signal terminals is implemented by providing slits.

18. A method for producing high-frequency modules as claimed in claim 17, wherein said electrically isolating the signal terminals at each of the two side edges of the sub substrates from the signal terminals provided on the side edge of the adjacent sub substrate while the connector regions of the master substrate remain linked to the sub substrates is followed by covering the sub substrates with a shielding case.

19. A method for producing high-frequency modules as claimed in claim 18, wherein the shielding case is fabricated by punching a sheet of material with dies, bending the sheet in the direction of punching to form bends, and soldering distal ends of the bends or legs to the grounding terminals provided on the side edges of the sub substrate.

20. A method for producing high-frequency modules as claimed in claim 18, wherein the shielding case is marked down on its top side using a laser beam.

21. A method for producing high-frequency modules as claimed in claim 16, wherein said electrically isolating the signal terminals is implemented by providing grooves.

22. A method for producing high-frequency modules as claimed in claim 16, wherein when the pins are moved to engage in direct contact at said conducting the inspection, grounding pin are allowed to touch first and when disengaging, to depart last.

23. A method for producing high-frequency modules as claimed in claim 16, wherein said conducting the inspection is performed by inspecting a group of the sub substrates together.

24. A method for producing high-frequency modules as claimed in claim 23, wherein said conducting the inspection is performed by pressing the pins against substantially identical locations on the signal terminals of each of the sub substrates and feeding the signal terminals with an electric signal.

25. A method for producing high-frequency modules as claimed in claim 16, further comprising mounting the separated sub substrates on a tape.

26. A method for producing high-frequency modules, said method comprising:

fabricating, on a master substrate, a plurality of sub substrates linked to connector regions at both ends of the master substrate, each of the sub substrates provided to have an identical pattern of circuit developed thereon, and mounting electronic components on each of the sub substrates;

covering each of the sub substrates having electronic components mounted thereon with a metal shielding case while the sub substrates are in a worksheet form; and separating the sub substrates from the master substrate, after said covering, by cutting along the side edges of the sub substrates.

27. A method for producing high-frequency modules as claimed in claim 26, wherein the shielding case is fabricated by punching a sheet of material with dies, bending the sheet in the direction of punching to form bends, and soldering distal ends of the bends or legs to grounding terminals provided on the side edges of the sub substrate.

28. A method for producing high-frequency modules, said method comprising:

fabricating, on a master substrate, a plurality of sub substrates linked to connector regions at both ends of the master substrate, each of the sub substrates provided to have an identical pattern of circuit developed thereon, and mounting electronic components on each of the sub substrates;

covering each of the sub substrates having electronic components mounted thereon with a metal shielding case; and marking on a top side of the metal shielding case of each of the sub substrates;

separating the sub substrates from the master substrate, after said marking, by cutting along the side edges of the sub substrates.

29. A method of producing high-frequency modules comprising:

a first step of fabricating, on a master substrate, a plurality of sub substrates linked to connector regions at both ends of the master substrate, each of the sub substrates formed of substantially a rectangular shape and having an identical pattern of circuit developed thereon, and mounting electronic components on each of the sub substrates;

a second step of, after said first step, covering each of the sub substrates with a metal shielding case; and a third step of, after said second step, separating the sub substrates from the master substrate by cutting along side edges of the sub substrates;

wherein the metal shielding case is fabricated by bending a metal sheet to form legs, and ground terminals are provided on the side edges of the sub substrates; and wherein a burr is created on an edge of the metal sheet during the fabrication of the shielding case and the burr generates a gap between an edge of each grounding terminal and the corresponding leg.

30. A method of producing high-frequency modules according to claim 29, wherein the cutting edges of the sub substrate are created by cutting along the side edges so as to extend more outwardly than the shielding case.

31. A method of producing high-frequency modules according to claim 29, wherein the cutting edges of the sub substrate are created by cutting along the side edges so as to be substantially flush with sides of the shielding case.

32. A method of producing high-frequency modules according to claim 31, wherein the sides of the shielding case are more roughed on their surface than on top.

33. A method of producing high-frequency modules according to claim 32, wherein the sub substrates are separated from each other with the use of a rotary blade which is also adapted for roughing the sides of the shielding case.

34. A method of producing high-frequency modules according to claim 29, wherein the shielding case is fabricated by punching a sheet of material with dies, bending the sheet in the direction of punching to form the bends, and soldering distal ends of the bends or legs to the grounding terminals provided on the side edges of the sub substrate.

35. A method for producing high-frequency modules, said method comprising:

fabricating, on a master substrate, a plurality of sub substrates linked to connector regions at both ends of the master substrate, each of the sub substrates provided to have an identical pattern of circuit developed thereon, and mounting electronic components on each of the sub substrates;

covering each of the sub substrates having electronic components mounted thereon with a metal shielding case; and separating the sub substrates from the master substrate, after said covering, by cutting along the side edges of the sub substrates;

wherein the metal shielding case is fabricated by bending a metal sheet to form legs, and ground terminals are provided on the side edges of the sub substrates; and wherein a burr is created on an edge of the metal sheet during the fabrication of the shielding case and the burr generates a gap between an edge of each grounding terminal and the corresponding leg.

36. A method of producing high-frequency modules comprising:

a first step of fabricating, on a master substrate, a plurality of sub substrates linked to connector regions at both ends of the master substrate, each of the sub substrates formed of substantially a rectangular shape and having an identical pattern of circuit developed thereon, and mounting electronic components on each of the sub substrates;

a second step of, after said first step, covering each of the sub substrates with a metal shielding case;

a third step of engaging pins of an inspection tool in direct contact with signal terminals of the sub substrates to conduct an inspection such that grounding pins of the engaging pins come into contact the earliest with, and depart at the latest from, the signal terminals; and a fourth step of, after said second step, separating the sub substrates from the master substrate by cutting along side edges of the sub substrates.

37. A method for producing high-frequency modules, said method comprising:

fabricating, on a master substrate, a plurality of sub substrates linked to connector regions at both ends of the master substrate, each of the sub substrates provided to have an identical pattern of circuit developed thereon, and mounting electronic components on each of the sub substrates;

covering each of the sub substrates having electronic components mounted thereon with a metal shielding case;

engaging pins of an inspection tool in direct contact with signal terminals of the sub substrates to conduct an inspection such that grounding pins of the engaging pins come into contact the earliest with, and depart at the latest from, the signal terminals; and separating the sub substrates from the master substrate, after said covering, by cutting along the side edges of the sub substrates.

* * * * *

UNITED STATES PATENT AND TRADEMARK OFFICE
CERTIFICATE OF CORRECTION

PATENT NO. : 6,675,471 B1
DATED : January 13, 2004
INVENTOR(S) : Junichi Kimura et al.

It is certified that error appears in the above-identified patent and that said Letters Patent is hereby corrected as shown below:

<u>Title page,</u>
Item [56], References Cited, FOREIGN PATENT DOCUMENTS, please add:

-- JP    10-58302    3/1998 --

Signed and Sealed this

First Day of June, 2004

JON W. DUDAS
*Acting Director of the United States Patent and Trademark Office*